(12) United States Patent
Nahum

(10) Patent No.: US 10,068,465 B2
(45) Date of Patent: Sep. 4, 2018

(54) BATTERY-LESS DATA TRANSMISSION MODULE ACCESSORY FOR PORTABLE AND HANDHELD METROLOGY DEVICES

(71) Applicant: Mitutoyo Corporation, Kanagawa-ken (JP)

(72) Inventor: Michael Nahum, Kirkland, WA (US)

(73) Assignee: Mitutoyo Corporation, Kanagawa-ken (JP)

( * ) Notice: Subject to any disclaimer, the term of this patent is extended or adjusted under 35 U.S.C. 154(b) by 2 days.

(21) Appl. No.: 15/394,182

(22) Filed: Dec. 29, 2016

(65) Prior Publication Data

US 2017/0110007 A1 Apr. 20, 2017

Related U.S. Application Data

(63) Continuation-in-part of application No. 14/521,330, filed on Oct. 22, 2014.

(51) Int. Cl.
*G08C 17/02* (2006.01)
*H04W 52/02* (2009.01)
(Continued)

(52) U.S. Cl.
CPC .............. *G08C 17/02* (2013.01); *F03G 7/005* (2013.01); *G01B 3/205* (2013.01); *H01L 41/22* (2013.01);
(Continued)

(58) Field of Classification Search
CPC combination set(s) only.
See application file for complete search history.

(56) References Cited

U.S. PATENT DOCUMENTS 5,374,449 A 12/1994 Bühlmann et al.
5,574,381 A 11/1996 Andermo et al.
(Continued)

OTHER PUBLICATIONS

Curty, J-P., Norbert Joehl, Catherine Dehollain, and Michel J. Declercq. "Remotely powered addressable UHF RFID integrated system." IEEE Journal of Solid-State Circuits 40, No. 11 (2005): 2193-2202.*

(Continued)

*Primary Examiner* — Yuwen Pan
*Assistant Examiner* — Zhitong Chen
(74) *Attorney, Agent, or Firm* — Seed IP Law Group LLP

(57) ABSTRACT

A data transmission module is provided as a battery-less accessory for attachment to portable metrology devices (e.g., handheld digital calipers, micrometers, indicators, etc.). Rather than utilizing battery resources from the metrology devices, the data transmission module utilizes energy harvested wirelessly from a remote data node (e.g., a computer system, display, etc.) to power transmission of measurement data signals to the remote data node. The data transmission module may receive sufficient power when relatively close to the remote data node, such as when a user is near the remote data node when operating the metrology device to obtain dimensional measurements of a workpiece. A wireless data generator of the data transmission module may be configured to wirelessly communicate measurement data signals using: the harvested energy; or a modulated reflection of, or coupling to, a received energy supply field from the remote data node; or a combination thereof.

20 Claims, 10 Drawing Sheets

(51) Int. Cl.
  *G01B 3/20*   (2006.01)
  *F03G 7/00*   (2006.01)
  *H01L 41/22*  (2013.01)
  *H04B 5/00*   (2006.01)

(52) U.S. Cl.
  CPC ........... *H04B 5/00* (2013.01); *G08C 2200/00* (2013.01); *H04W 52/0251* (2013.01)

(56) References Cited

U.S. PATENT DOCUMENTS

| | | | |
|---|---|---|---|
| 5,864,323 | A | 1/1999 | Berthon |
| 5,973,494 | A | 10/1999 | Masreliez et al. |
| RE37,490 | E | 1/2002 | Andermo et al. |
| 6,671,976 | B2 | 1/2004 | Takahashi et al. |
| 6,700,310 | B2 | 3/2004 | Maue et al. |
| 6,747,500 | B2 | 6/2004 | Mawet |
| 6,753,686 | B2 | 6/2004 | Tsuboi |
| 6,859,762 | B2 | 2/2005 | Mawet |
| 7,084,605 | B2 | 8/2006 | Mickle et al. |
| 7,271,677 | B2 | 9/2007 | Troyk et al. |
| 7,305,327 | B2 | 12/2007 | Sper |
| 7,310,069 | B2 | 12/2007 | Nantz et al. |
| 7,400,415 | B2 | 7/2008 | Patzwald et al. |
| 7,528,711 | B2 | 5/2009 | Kates |
| 7,715,885 | B2 | 5/2010 | Arunan et al. |
| 8,035,255 | B2 | 10/2011 | Kurs et al. |
| 8,076,801 | B2 | 12/2011 | Karalis et al. |
| 8,131,896 | B2 | 3/2012 | Yamagata et al. |
| 8,963,781 | B2 | 2/2015 | Lin et al. |
| 9,000,914 | B2 | 4/2015 | Baker et al. |
| 9,159,017 | B2 | 10/2015 | Poplawski et al. |
| 9,246,358 | B2 | 1/2016 | Jung et al. |
| 2010/0190436 | A1* | 7/2010 | Cook ............... H04B 5/00 455/41.1 |
| 2012/0203504 | A1* | 8/2012 | Jordil ............... G01B 3/205 702/162 |
| 2013/0249349 | A1 | 9/2013 | Matter et al. |
| 2014/0150272 | A1 | 6/2014 | Emtman et al. |
| 2014/0150274 | A1 | 6/2014 | Emtman et al. |

OTHER PUBLICATIONS

Akan et al., "Wireless Passive Sensor Networks," *IEEE Communications Magazine* 47(8):92-99, 2009.

Algra, "Dynapic® Wireless Developer Kit," Data Sheet, rev. Aug. 29, 2013, 9 pages.

Algra, "Dynapic® Wireless Receiver Module," Data Sheet, rev. Aug. 29, 2013, 5 pages.

Algra, "Dynapic® Wireless Sender Module," Data Sheet, rev. May 28, 2013, 6 pages.

Buettner et al., "Demonstration: RFID Sensor Networks with the Intel WISP," *Conference on Embedded Networked Sensor Systems (Sensys)*, 2 pages, 2008.

Chen et al., "Range Extension of Passive Wake-up Radio Systems through Energy Harvesting," *IEEE ICC 2013—Ad-hoc and Sensor Networking Symposium*, 2013, 6 pages.

Donno et al., "Enabling Self-Powered Autonomous Wireless Sensors with New-Generation I²C-RFID Chips," *2013 IEEE MTT-S International Microwave Symposium Digest (MTT)*, 2013, 4 pages.

Fowler, "Heavy Duty Electronic Digital Caliper," Data Sheet, version date, Jun. 24, 2004, 1 page.

Ghaed et al., "Circuits for a Cubic-Millimeter Energy-Autonomous Wireless Intraocular Pressure Monitor," *IEEE Transactions on Circuits and Systems—I: Regular Papers* 60(12):3152-3162, 2013.

Grady, "Millimeter Scale Energy Harvesting Based Sensors," *EEWeb | Electrical Engineering Community*, pp. 16-19, 2011.

Han et al., "Wireless Power Transfer Using Resonant Inductive Coupling for 3D Integrated ICs," *3D Systems Integration Conference (3DIC), IEEE International*, 2011, 5 pages.

Heute die Technologie von Morgen beherrschen, "RFID-Handbook," downloaded from URL=http://rfid-handbook.de/about-rfid.html?showall=&limitstart= on Nov. 17, 2016, 8 pages.

Hong et al., "Wi-Fi Energy Harvester for Low Power RFID Application," *Progress in Electromagnetics Research C* 40:69-81, 2013.

Kordzadeh et al., "A New Reduced Size Microstrip Patch Antenna with Fractal Shaped Defects," *Progress in Electromagnetics Research B* 11:29-37, 2009.

Lallart et al., "Synchronized switch harvesting applied to self-powered smart systems: Piezoactive microgenerators for autonomous wireless receivers," *Sensors and Actuators A* 147:263-272, 2008.

Mahr Exactly, "Dimensional Metrology | Precision Gages, Measuring Instruments with Integrated Wireless System," MarConnect: Integrated Wireless, Apr. 2013, 20 pages.

Mitrokotsa et al., *RFID and Sensor Networks: Architectures, Protocols, Security and Integrations*, Aurbach Publications, CRC Press, Taylor and Francis, United Kingdom, Chapter 18, pp. 511-535, "Integrated RFID and Sensor Networks: Architectures and Applications," 26 pages, 2009.

Mitutoyo, "Input Tool, Measurement Data Input Unit," Catalog No. E4250-264, 6 pages.

Mitutoyo, "Mitutoyo 959143 Data Hold Unit," retrieved from <<http://www.amazon.com/Mitutoyo-959143-Data-Hold-Unit/dp/B003VM7XLI/ref=sr_1_1?ie=UTF8&keywords=MITUTOYO=959143+daTA+hOLD+uNIT>>, 2 pages.

Mumenthaler, "Dynapic® Wireless : World's First Piezo Wireless Switch: No Battery, No Cable, No Wear, Slim Design," Algra product brochure, 26 pages.

Park et al., "RFID Label Tag Design for Metallic Surface Environments," *Sensors* 11:938-948, 2011.

Rabaey et al., "Powering and Communicating with mm-size Implants," *IEEE Xplore Conference: Design, Automation & Test in Europe Conference & Exhibition*, 6 pages, 2011.

Rao et al., "Antenna Design for UHF RFID Tags: A Review and a Practical Application," *IEEE Transactions on Antennas and Propagation* 53(12):3870-3876, 2005.

Sample et al., "Design of an RFID-Based Batter-Free Programmable Sensing Platform," *IEEE Transactions on Instrumentation and Measurement* 57(11):2608-2615, 2008.

Stanley-Marbell et al., "An 0.9 × 1.2, Low Power, Energy-Harvesting System with Custom Multi-Channel Communication Interface," *Proceedings of the conferences on Design, automation and test in Europe*, EDA Consortium, pp. 15-20, 2007.

Talla et al., "Wi-Fi RF Energy Harvesting for Battery-Free Wearable Radio Platforms," *2015 IEEE International Conference on RFID*, 2015, 8 pages.

Tuan et al., "Design of UHF RFID Passive Tag Antenna Pasted on a Large Metal Structure," *PIERS Online* 7(8):706-710, 2011.

Zhang, "Leveraging Backscatter for Ultra-Low Power Wireless Sensing Systems," College Dissertation presented to the University of Massachusetts Amherst, 2016, 151 pages.

Zungeru et al., *Green Mobile Devices and Networks*, Taylor & Francis, United Kingdom, 2012, Chapter 13 "Radio Frequency Energy Harvesting and Management for Wireless Sensor Networks," 40 pages.

\* cited by examiner

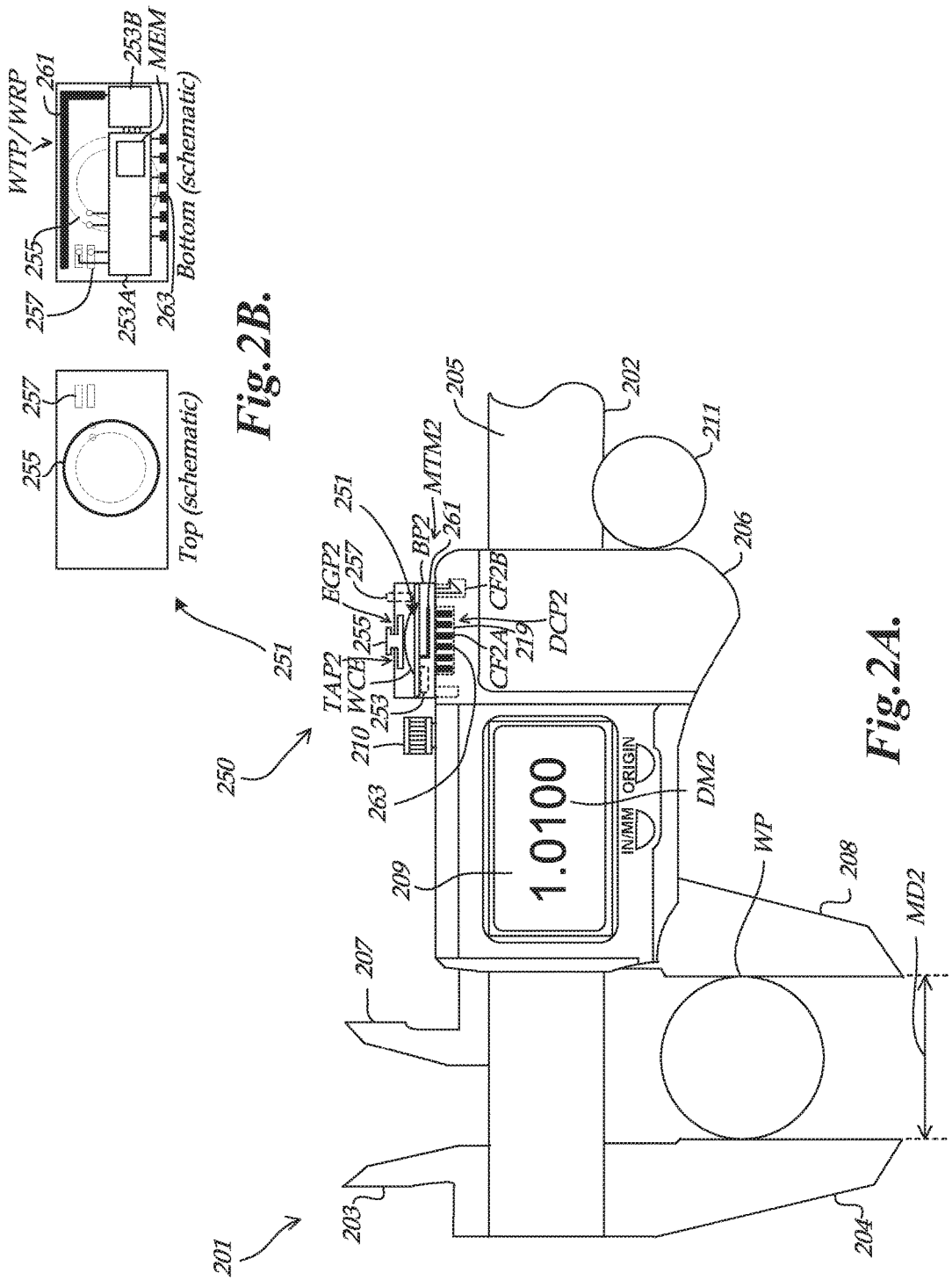

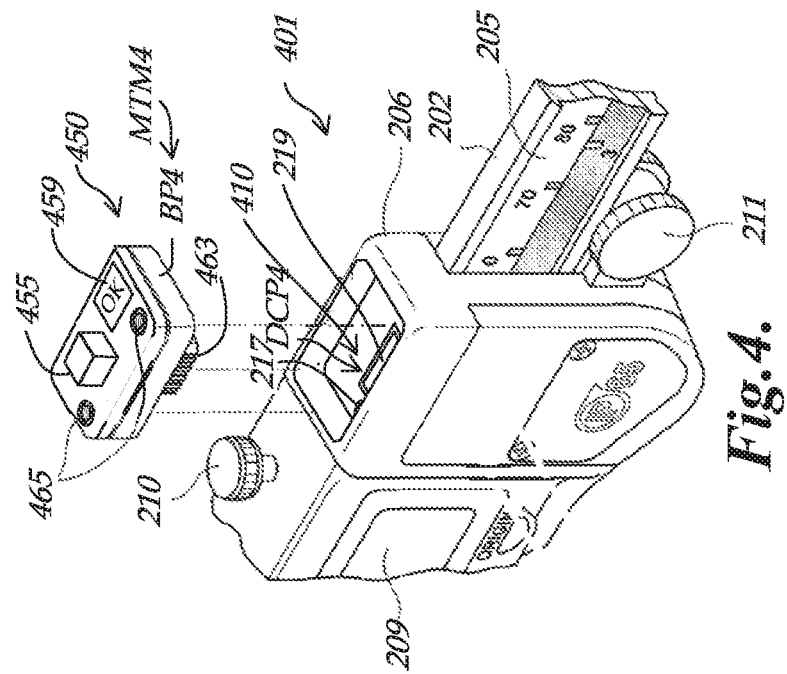
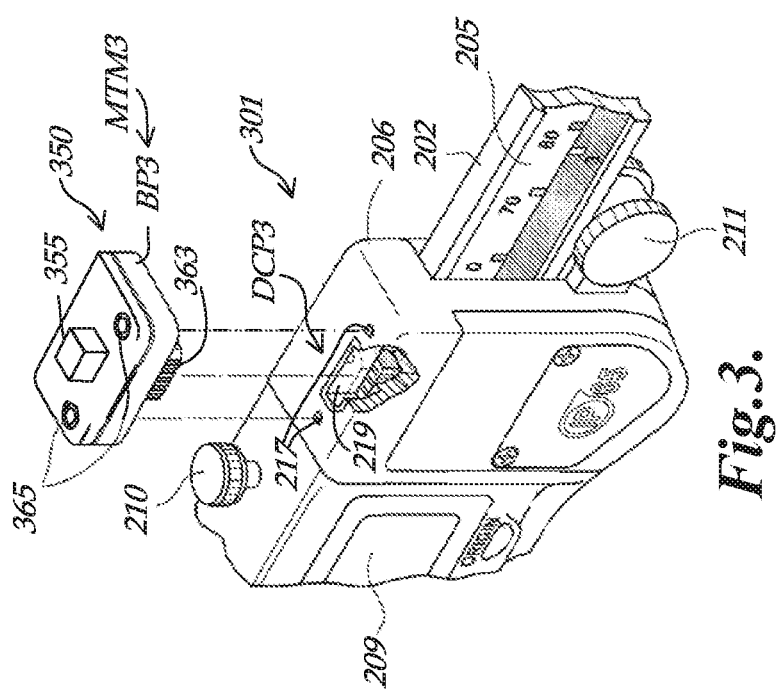
Fig. 4.
Fig. 3.

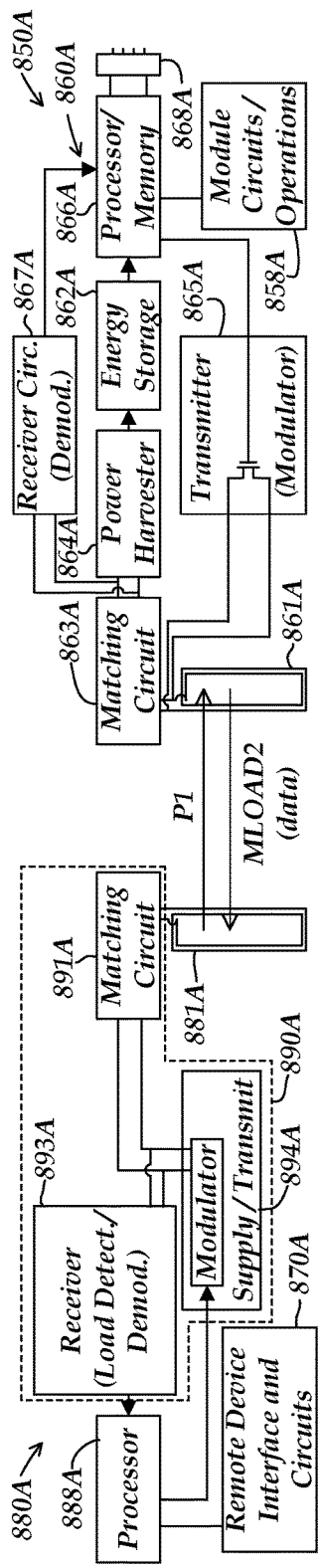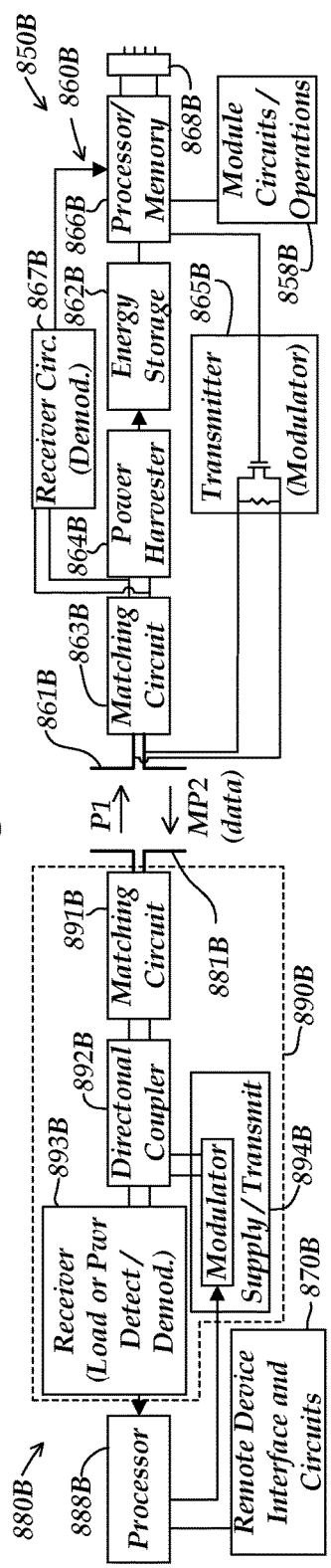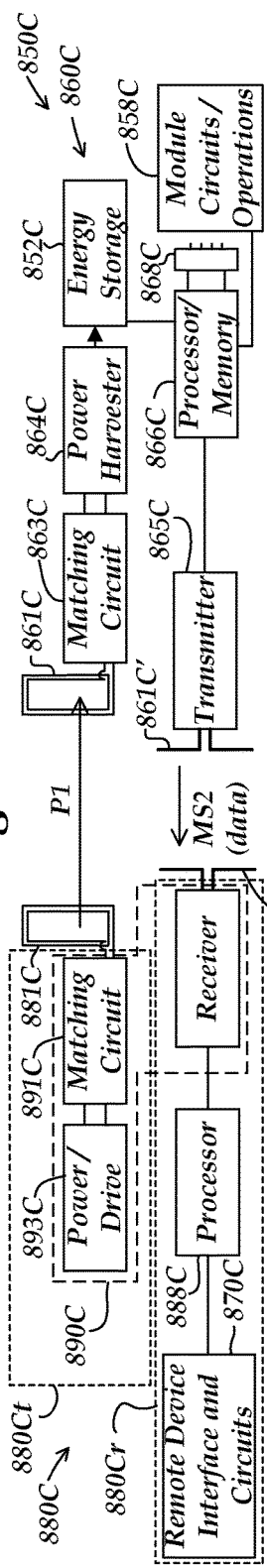
*Fig. 8A.* *Fig. 8B.* *Fig. 8C.*

BATTERY-LESS DATA TRANSMISSION MODULE ACCESSORY FOR PORTABLE AND HANDHELD METROLOGY DEVICES

CROSS-REFERENCE TO RELATED APPLICATION(S)

This application is a continuation-in-part of U.S. patent application Ser. No. 14/521,330, entitled "MEASUREMENT TRANSMISSION SYSTEM FOR HANDHELD METROLOGY TOOLS" filed on Oct. 22, 2014, the disclosure of which is hereby incorporated herein by reference in its entirety.

BACKGROUND

Technical Field

The invention relates to metrology systems, and more particularly to a battery-less data transmission module accessory for wirelessly communicating measurement data from a battery-powered portable measuring device to a remote data node.

Description of the Related Art

Various battery-powered portable (e.g., handheld) measuring devices are currently available. One example of such a battery-powered portable measuring device is a displacement measuring instrument, such as a handheld electronic caliper which can be used for making precise measurements of physical dimensions of objects (e.g., measuring machined parts to ensure that they are meeting tolerance requirements). Exemplary electronic calipers are disclosed in commonly assigned U.S. Pat. Nos. RE37,490, 5,574,381, and 5,973,494, each of which is hereby incorporated by reference in its entirety.

In general, the less power such calipers or other battery-powered portable measuring devices use, the fewer batteries they will require and the longer they will operate before the batteries need to be replaced or replenished. However, reducing the power requirements of such devices beyond current "micro watt" levels is a complex task. Such devices are required to make highly accurate measurements, and the complex signal processing techniques that have been developed for such devices tend to complicate the process of designing circuitry that will both accomplish the desired accuracy and operate at low voltage and power levels. In addition, in comparison to the basic operating and measuring requirements, certain functions (e.g., wireless transmission of measurement data) may require significant energy resources. In addition to the power requirements for such functions, the reliability or predictability of the measurements may be affected by various factors (e.g., accidental movement of the jaws of the caliper while the function is being performed). A need exists for improving the ability to perform functions such as the wireless transmission of measurement data in a manner that ensures that desirable measurement data is transmitted while minimizing the drain on the portable measuring device's battery.

BRIEF SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Based on the need outlined above, and additional needs and problem outlined in the introduction to FIGS. 7-11, further below, it will be appreciated that it would be desirable for a wireless data transmission module to operate and provide measurement data more or less continuously, without the need for battery power or manual actuation. It would be desirable for a wireless data transmission module to be capable of responding to a remote request for measurement data from a remote data node, and/or simply automatically or semi-automatically transmit measurement data when such a remote data node is in the vicinity of the wireless data transmission module. It would be desirable for the wireless data transmission module to be compact, lightweight, and ergonomically compatible and easy to use with a variety of handheld battery-powered portable measuring devices, as well as being operable with inconveniently located machine-mounted battery powered measuring devices. It would be desirable for the wireless data transmission module to work over a range of convenient distances from the remote data node. These and other considerations motivate the following:

A data transmission module is provided for inputting measurement data from a battery-powered portable measuring device and wirelessly transmitting corresponding measurement data signals to a remote data node. The remote data node is configured to generate at least one energy supply field (e.g., for providing power to the data transmission module) and to wirelessly receive the measurement data signals from the data transmission module. In various implementations, the data transmission module includes a body portion, a field receiver, a wireless data generator, and a data transmission and energy manager circuit. The body portion is configured to physically couple to the battery-powered portable measuring device. The field receiver is configured to receive the energy supply field from the remote data node. The wireless data generator wirelessly communicates the measurement data signals to the remote data node. The data transmission and energy manager circuit includes a data connector configured to couple to a data connector on the battery-powered portable measuring device.

In various implementations, the data transmission and energy manager circuit is configured to perform various operations, such as the following. Energy may be harvested such as is received by the field receiver, at least a portion of the harvested energy may be stored in the data transmission module, and the harvested energy may be managed. A communication connection may be established with the remote data node. The measurement data from the battery-powered portable measuring device may be input through the data connector, and measurement data signals corresponding to the input measurement data may be wirelessly transmitted to the remote data node using the wireless data generator.

In various implementations, the battery-powered portable measuring device may be powered by a battery that is not part of the data transmission module and that is not connected as a power supply to the data transmission module, and that is configured to operate and display the measurement data on a self-contained display, regardless of whether battery-powered portable measuring device is coupled to the data transmission module. In various implementations, the wireless data generator may be configured to wirelessly transmit the measurement data signals to the remote data node using only a) the harvested energy or b) a modulated reflection of, or coupling to, the received energy supply field from the remote data node, or c) a combination of a) and b).

BRIEF DESCRIPTION OF THE DRAWINGS

FIGS. 2A and 2B are diagrams of a second exemplary embodiment of a measurement transmission system as coupled to a handheld measuring device for wirelessly transmitting measurement data to a remote system;

FIG. 3 is a diagram of a perspective view of a third exemplary embodiment of a measurement transmission system as coupled to a handheld measuring device;

FIG. 4 is a diagram of a perspective view of a fourth exemplary embodiment of a measurement transmission system as coupled to a handheld measuring device with a recessed portion for receiving the measurement transmission system;

FIGS. 8A-8C are block diagrams illustrating exemplary implementations of various modes of energy supply field coupling and data transmission between a data transmission module and a remote data node;

DETAILED DESCRIPTION

Figure 1:
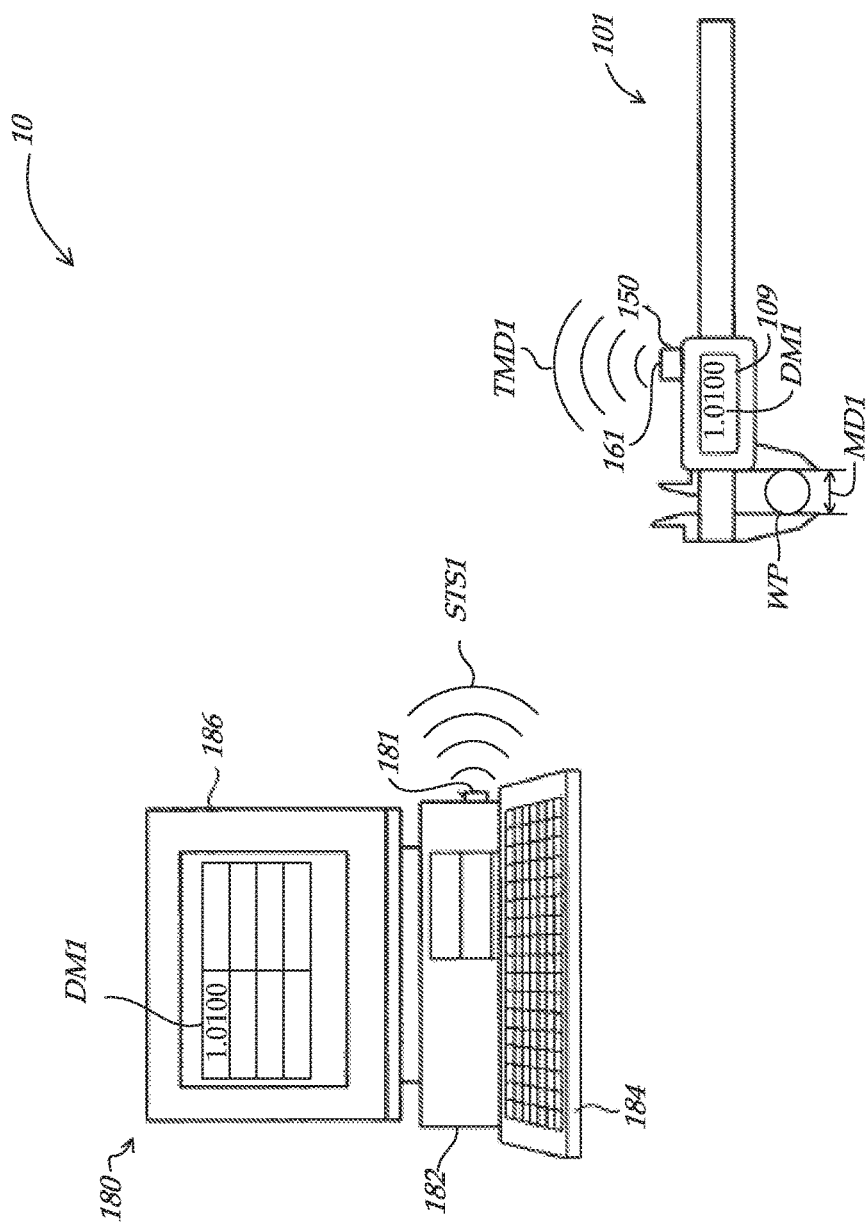
FIG. 1 is a block diagram of a first exemplary embodiment of a measurement transmission system as coupled to a handheld measuring device and as wirelessly transmitting measurement data to a remote system.

FIG. 1 is a block diagram of an exemplary measurement system 10 including a first exemplary embodiment of a measurement transmission system 150 as coupled to a handheld measuring device 101 and as wirelessly transmitting measurement data from the handheld measuring device 101 to a remote system 180. The transmitted measurement data TMD1 may be related to one or more measurements (e.g., a measured dimension MD1) of a workpiece WP taken with the handheld measuring device 101. The remote system 180 may include a computer system 182 that is operably connected to a keyboard 184 and a monitor 186 and/or other input or output devices. A representation of the measurement data from the handheld measuring device 101 may be displayed on a display 109 of the handheld measuring device 101 and/or on the monitor 186 of the remote system 180.

The measurement transmission system 150 may include an antenna 161 for wirelessly transmitting the measurement data and the remote system 180 may include an antenna 181 for receiving the transmitted measurement data TMD1. In various implementations, once the transmitted measurement data TMD1 is successfully received, the remote system 180 may utilize the antenna 181 to wirelessly transmit a successful transmission signal STS1, which may be received at the antenna 161 of the measurement transmission system 150. As will be described in more detail below, in various implementations once a successful transmission signal STS1 is received, or once a successful transmission is otherwise verified, the measurement transmission system 150 may perform various operations (e.g., performing transmission cycle termination operations to cease wireless transmission, performing data holding release operations to terminate a data holding state, providing a notification on a display that indicates that the transmission was successful, etc.)

As will also be described in more detail below, in various implementations the measurement transmission system 150 may include an energy generation portion that converts work done by a user (e.g., operating an energy generation actuator such as a button, slide, lever, etc.) into electrical energy for wirelessly transmitting the measurement data to the remote system 180. It will be appreciated that wireless transmission of data may otherwise utilize significant battery resources in handheld precision measuring devices, and that by powering the wireless transmission with a separate energy generation portion such significant drains on the main battery may be avoided. In various implementations, the measurement transmission system 180 may additionally or alternatively include a data hold actuator that may be operated manually by a user for triggering operations that initiate a data holding state that freezes a set of measurement data to be used for subsequent wireless transmission to the remote system 180. It will be appreciated that a data holding state may provide various advantages, such as allowing a user to temporarily save the measurement data and verify on a display (e.g., of the measurement transmission system and/or the display 109) that the measurement value is as expected (e.g., in case the caliper jaws are accidentally moved when the energy generation and/or transmission actuators or other elements are operated by the user).

FIGS. 2A and 2B are diagrams of a second exemplary embodiment of a measurement transmission system 250 as coupled to a handheld measuring device 201 for wirelessly transmitting measurement data to a remote system (e.g., the remote system 180 of FIG. 1). It will be appreciated that the measurement transmission system 250 may have certain characteristics that are similar to those of the measurement transmission system 150 of FIG. 1, and will be understood to operate similarly except as otherwise described below. In the embodiment of FIG. 2A, the handheld measuring device 201 is a caliper capable of outputting measurement data obtained from measurement of a workpiece WP (e.g., corresponding to a measured dimension MD2 of the workpiece WP). The measurement transmission system 250 includes a first actuator 255 (e.g., a button), which in various implementations may provide functions as an energy generation actuator, a transmission actuator and/or a data hold actuator, as will be described in more detail below.

In various implementations, the first actuator 255 may be part of a transmission activation portion TAP2 and/or an energy generation portion EGP2. For example, as illustrated in FIG. 2B, a transmission activation portion TAP2 may be designated as including the first actuator 255 (e.g., designated as a transmission actuator), and portions of circuitry 253A and 253B on a circuit board assembly 251. An associated output-side wireless transmission portion WTP on the circuit board assembly 251 may be designated as including portions of circuitry 253B and an antenna 261. Examples of the circuitry 253A and 253B will be described in more detail below with respect to FIG. 6. For the operation of the transmission activation portion TAP2, switching functions in circuitry 253A may be activated by a user operating the first actuator 255 to trigger operations including a transmission cycle of operations which include utilizing circuitry 253B as coupled to the antenna 261 for wirelessly transmitting the measurement data to a remote system.

As further illustrated in FIGS. 2A and 2B, an energy generation portion EGP2 may be designated as including the first actuator 255 (e.g., designated as an energy generation actuator), a work conversion element WCE, and portions of circuitry 253A. For the operation of the energy generation portion EGP2, the first actuator 255 may be operated manually by a user, and is configured to perform work on the work conversion element WCE (e.g., a piezoelectric element such as a film or igniter, an electromagnetic generator, etc.) While the first actuator 255 is represented in FIG. 2A as a button, it will be appreciated that in other implementations alternative elements may be utilized (e.g., slides, levers, etc.), which may be utilized to perform work on corresponding work conversion elements. The work conversion element WCE converts the work into electrical energy that is utilized for powering at least the output-side wireless transmission portion WTP (e.g., including portions of circuitry 253B and the antenna 261) for wirelessly transmitting the measurement data to the remote system.

In one implementation, one transmission cycle of operations of the transmission activation portion TAP2 may consume a first amount of energy, and the energy generation portion EGP2 may be configured such that a single actuation cycle of the energy generation actuator 255 generates a second amount of electrical energy that is greater than the first amount of energy. In other words, in the implementation of FIG. 2, the overall operations of the measurement transmission system 250 may allow a user to press the actuator button 255 a single time to both trigger the wireless transmission of the measurement data and to generate enough electrical energy to power the wireless transmission.

In various implementations, the first actuator 255 may also or alternatively provide functions as a data hold actuator. In such implementations, the first actuator 255 may be operated manually by a user for triggering operations that initiate a data holding state that freezes a set of measurement data to be used for subsequent wireless transmission to the remote system. In one implementation, the handheld measuring device 201 may include a measurement display 209 and a hold mode of operation which includes freezing a current measurement value on the measurement display 209. In such an implementation, the operations that initiate a data holding state that freezes a set of measurement data may include triggering the hold mode of operation of the handheld measuring device 201 through a device-side data connection portion DCP2 (e.g., including a female connector 219), as will be described in more detail below. In an alternative implementation, the operations that initiate a data holding state that freezes a set of measurement data may include temporarily storing the set of measurement data in a memory MEM2 of the circuitry 253A of the measurement transmission system 250 for subsequent wireless transmission to the remote system.

In one implementation, the transmission cycle of operations may further include data holding release operations, which are performed subsequently to successfully transmitting the measurement data and which terminate the data holding state. For example, as described above with respect to FIG. 1, once the remote system 180 receives the wireless transmission of the measurement data, it may send a "successful transmission" signal STS1 back to the measurement transmission system 250. In such an instance, once the successful transmission signal STS1 is received, the measurement transmission system 150 may perform data holding release operations to terminate the data holding state. It will be appreciated that such functionality may provide a manner in which a user may be informed when the measurement data transmission has been successfully completed and that another measurement may be taken, in that the measurement indicated on the measurement display 209 may remain frozen until the process is complete.

In one implementation, the transmission cycle of operations may further include transmission cycle termination operations, which are performed subsequently to successfully transmitting the measurement data and which terminate at least some operations of the measurement transmission system 250 until an actuator (e.g., actuator 255) of the measurement transmission system 250 is again operated manually by a user. Energy consumption may be reduced and computational capacity may be conserved through such termination operations. The measurement transmission system 250 may also in addition to the wireless transmission portion WTP be designated as including a wireless receiver portion WRP (e.g., including the antenna 261 and portions of the circuitry 253B), wherein the transmission cycle termination operations may be performed subsequently to receiving a successful transmission signal STS1 from the remote system 180, as described above. The measurement transmission system may also or alternatively be enabled to provide an error message to a user if the transmission of the measurement data is not successful (e.g., if a successful transmission signal is not received from the remote system within a certain amount of time after the initiation of the wireless measurement data transmission).

In an implementation where the first actuator 255 provides multiple functions as a transmission actuator, an energy generation actuator and/or a data hold actuator, state-dependent operations may be utilized. For example, in one implementation state-dependent operations may indicate that a user will operate the actuator 255 (e.g., press the button 255) once to trigger operations that initiate the data holding state, and then operate the actuator 255 again to trigger the set of operations that includes the transmission cycle of operations and/or to generate energy for performing the data transmission. In such an implementation, the first press of the button 255 may freeze the measurement data (e.g., for which the user could verify the accuracy of the measurement on a display and further movement of components of the handheld measuring device 201 would not accidentally alter the measurement), after which the second press of the button 255 would wirelessly transmit the frozen/verified measurement data to the remote system 180. As described above, in one implementation a successful transmission signal STS1 received back from the remote system 180 may then trigger an unfreezing of the data holding state and/or a providing of an indication on a display that the transmission was successful. Thereafter, another measurement may be taken and transmitted, following the same procedure of starting with a first press of the button 255 to freeze the new measurement data, after which the second press of the button 255 may trigger the wireless transmission of the new measurement data.

In various implementations, a second actuator 257 may alternatively be provided for providing functions as the transmission actuator and/or the data hold actuator. For example, while the first actuator 255 with the associated work conversion element WCE may be utilized for converting work into electrical energy, the second actuator 257 as coupled to the circuitry 253A may be utilized in one implementation to perform a switching function to act as the transmission actuator and/or the data hold actuator. In an implementation where the second actuator 257 performs functions as the transmission actuator, in one configuration a user may first operate the first actuator 255 to generate electrical energy for powering the wireless transmission, and then may operate the second actuator 257 to trigger the wireless transmission of the measurement data. In an implementation where the second actuator 257 performs functions as the data hold actuator, in one configuration a user may first operate the second actuator 257 to freeze the measurement data, and then may operate the first actuator 255 to trigger the transmission cycle of operations and/or to generate energy for powering the wireless data transmission.

As will be described in more detail below, in various implementations the measurement transmission system 250 may include a transmission activation portion TAP2 and data hold functionality without an energy generation portion EGP2. For example, the measurement transmission system 250 may be made to include a separate battery and/or may be coupled to utilize electricity from a power supply of the handheld measuring device 201. In one such implementation, a single actuator may be utilized to provide the functions of the data hold actuator and the transmission actuator. For example, in one configuration a user may operate the actuator a first time to freeze the measurement data, and then may operate the actuator a second time to trigger the transmission cycle of operations, which are powered by a power source (e.g., a battery) of the handheld measuring device 201 or of the measurement transmission system 250. Alternatively, in one configuration a user may operate the actuator a single time to both freeze the measurement data and to trigger the transmission cycle of operations (e.g., for which the user could verify the accuracy of the measurement data that is being transmitted on a display, and for which the frozen state may be used to indicate that the transmission process has not yet been successfully completed, as described in the above examples).

In the example of FIG. 2, the measurement transmission system 250 is illustrated as being housed in a body portion BP which forms a measurement transmission module MTM which exposes at least the actuator 255 (e.g., a transmission actuator, an energy generation actuator and/or a data hold actuator) to the user. As will be described in more detail below, the measurement transmission module MTM may be configured to couple mechanically and/or electronically to at least one coupling feature (e.g., the data connection portion DCP2) on the handheld measuring device 201. The measurement transmission module MTM may in some instances not include a battery, and may be configured to operate without consuming power from the handheld measuring device 201 (e.g., relying instead on the energy generation portion EGP2 for providing any needed power). It will be appreciated that such a measurement transmission module MTM may be coupled to existing calipers (e.g., through an existing data port such as that of the data connection portion DCP2) and may add functionality for wireless measurement data transmission with data hold operations and/or energy generation for powering the wireless measurement data transmission. In an alternative implementation, a measurement transmission system may be housed in a handheld measuring device for providing such functionality, as will be described in more detail below with respect to FIG. 6.

In the example of FIG. 2, a coupling feature CF2A of the measurement transmission system 250 may include a device-side male connector 263 on a bottom portion, and an optional coupling feature CF2B may include an interlock portion that requires a specialized interlock release tool for removal. The device-side male connector 263 of the measurement transmission system 250 is received within the data connection portion DCP2 which includes the female connector 219 of the handheld measuring device 201. The female connector 219 may be part of the primary output port of the handheld measuring device 201 for providing measuring data to external devices (e.g., the remote system 180 of FIG. 1). In one implementation, the female connector 219 may include a sealing type elastomeric interconnector having alternating laminations of conductive portions and non-conductive portions, as described in more detail in commonly assigned U.S. Pat. No. 6,671,976, which is hereby incorporated by reference herein in its entirety. The device-side male connector 263 may be a complementary type of connector. However, more generally, any suitable connection method may be used, and the female connector 219 may be part of an RS-232 port, a serial port, an interface such as a Digimatic interface compatible with a connector (e.g., a flat connector, a circular 6-pin connector, a flat 10-pin connector, etc.) or any other output port for providing measuring data to an external device. Certain types of output ports and connectors are described in more detail in commonly assigned U.S. Pat. No. 8,131,896, which is hereby incorporated by reference herein in its entirety. It will be appreciated that while such connectors are often utilized for providing wired connections between handheld measuring devices and external devices (e.g., the remote system 180 of FIG. 1), the connectors may alternatively be utilized as described herein for attaching a measurement transmission system to a handheld measuring device for wirelessly transmitting the measurement data to a remote system.

As shown in FIG. 2A, the handheld measuring device 201 has a main scale 202 having a longitudinal portion, and a slider 206 provided on the main scale 202 in a manner capable of sliding movement along the longitudinal direction of the main scale 202. The main scale 202 has an inside measurement jaw 203 and an outside measurement jaw 204 respectively provided on the upper and lower periphery on the base end of the longitudinal portion and a scale 205 provided at an inner portion of the longitudinal portion along the longitudinal direction. The inside measurement jaw 203 and the outside measurement jaw 204 are respectively integrated to the main scale 202.

The outer surface of the slider 206 is provided with an inside measurement jaw 207 and an outside measurement jaw 208 respectively formed on the upper and lower periphery on the base end and a measurement display 209 formed on the front surface thereof. Further, a clamp screw 210 for fixing the position of the slider 206 is screwed thereto. A feed roller 211 to be in contact with the longitudinal portion of the main scale 202 to move the slider 206 by rotation thereof is provided on the outer surface of the slider 206.

During measurement operations, the slider 206 is moved by the feed roller 211 so that the inside measurement jaw 207 or outside measurement jaw 208 is in contact with a target portion of a workpiece WP together with the inside measurement jaw 203 or outside measurement jaw 204. At this time, the displacement of the slider 206 is detected by the scale 205 provided on the longitudinal portion of the main scale 202 and the detection head of the slider 206. The detected measurement signal which is represented as a measured dimension MD2 of the workpiece WP is processed as measurement data by a circuit board (not shown) to be displayed as a displayed measurement DM2 on the measurement display 209 at the front side of the slider 206 and/or to be wirelessly transmitted by the measurement transmission system 250 to a remote system (e.g., the remote system 180 of FIG. 1), as described above.

FIG. 3 is a diagram of a perspective view of a third exemplary embodiment of a measurement transmission system 350 as coupled to a handheld measuring device 301. It will be appreciated that the measurement transmission system 350 may have similar characteristics and will be understood to operate similarly to the measurement transmission systems 150 and 250, except as otherwise described below. As shown in FIG. 3, the measurement transmission system 350 includes an actuator 355, a device-side male connector 363, interlock fasteners 365, and a body portion BP3 as part of a measurement transmission module MTM3. The device-side male connector 363 is received within a female connector 219 of a data connection portion DCP3 of the handheld measuring device 301, similar to the device-side male connector 263 of FIG. 2. The handheld measuring device 301 includes holes 217 for receiving the interlock fasteners 365 of the measurement transmission system 350. In various implementations, the interlock fasteners 365 may consist of permanent, semi-permanent, or removable fasteners.

In various implementations, the actuator 355 may provide functions as an energy generation actuator, a transmission actuator and/or a data hold actuator, similar to the operations described above for the actuator 255 of FIG. 2. In the example of FIG. 3, only a single actuator 355 is provided as part of the measurement transmission system 350. Thus, in one implementation in which an energy generation portion is included in the measurement transmission system 350, a single operation of the actuator 355 (e.g., a press of the button 355) by a user may both trigger the transmission cycle of operations and generate energy for performing the wireless data transmission. In addition or alternatively, state-dependent operations may be utilized. For example, in one implementation where data holding operations are included in the measurement transmission system 350, state-dependent operations may include that a user will operate the actuator 355 once to trigger operations that initiate the data holding state, and then operate the actuator 355 again to trigger the set of operations that includes the transmission cycle of operations and/or to generate energy for performing the data transmission. In such an implementation, the first press of the button 355 may freeze the measurement data (e.g., for which the user could verify the accuracy of the frozen measurement on the measurement display 209 of the handheld measuring device 201), after which the second press of the button 355 may wirelessly transmit the frozen/verified measurement data to the remote system 180. In various implementations, the measurement display 209 may be utilized to provide an indication to the user of when a successful transmission signal is received from the remote system 180 or when the transmission is otherwise determined to have been successful. For example, as described above, in one implementation the indication may include an unfreezing of the measurement on the measurement display 209, or other indications may also be provided on the measurement display 209 (e.g., an "OK" symbol may be provided, etc.)

FIG. 4 is a diagram of a perspective view of a fourth exemplary embodiment of a measurement transmission system 450 as coupled to a handheld measuring device 401 with a recessed portion for receiving the measurement transmission system 450. It will be appreciated that the measurement transmission system 450 may have similar characteristics and will be understood to operate similarly to the measurement transmission systems 150, 250 and 350, except as otherwise described below. The measurement transmission system 450 and handheld measuring device 401 are shown to be substantially similar to the measurement transmission system 350 and a handheld measuring device 301 of FIG. 3, with the primary differences being a recessed portion 410 of the handheld measuring device 401 and a display 459 of the measurement transmission system 450.

As shown in FIG. 4, the recessed portion 410 is generally shaped so as to correspond to the outer body dimensions of a body portion BP4 of a measurement transmission module MTM4 which includes the measurement transmission system 450. The bottom of the recessed portion 410 includes a female connector 219 of a data connection portion DCP4 for receiving the device-side male connector 463 of the measurement transmission system 450. The recessed portion 410 also includes holes 217 for receiving interlock fasteners 465 of the measurement transmission system 450.

In one implementation, the recessed portion 410 has dimensions such that when the measurement transmission system 450 is secured within the recessed portion 410 by the interlock fasteners 465, the body portion BP4 of the measurement transmission system 450 is relatively flush with and does not significantly protrude from the surface of the handheld measuring device 401. When a new handheld measuring device 401 includes such a recessed portion 410, then it is convenient that the measurement transmission system 450 may be fit to it as an integrated portion, without disturbing the ideal ergonomics of the handheld measuring device 401. Alternatively, the measurement transmission system 450 may be left off to reduce the cost, and purchased and added at a later time if desired. Furthermore, an older model of a handheld measuring device (e.g., the handheld measuring device 301 of FIG. 3) that lacks the recessed portion 410 may still use the same measurement transmission system 450, which allows the economic benefits associated with fewer models and less inventory requirements for the measurement transmission system 450, and/or the handheld measuring devices 301 and/or 401.

In various implementations, the display 459 may be utilized to provide various types of information to a user regarding the operations of the measurement transmission system 450. For example, rather than utilizing the measurement display 209 of the handheld measuring device 201, the display 459 may alternatively provide an indication to the user of when a successful transmission signal is received from the remote system 180 or when the transmission is otherwise determined to have been successful. For example, as illustrated in FIG. 4, an "OK" symbol may be provided on the display 459 once a transmission has been determined to have been successful. In other implementations, a larger display may also be utilized (e.g., for displaying a frozen measurement data value, etc.) It will be appreciated that similar types displays may also be included with any of the previously described measurement transmission systems 150, 250 or 350.

Figure 5:
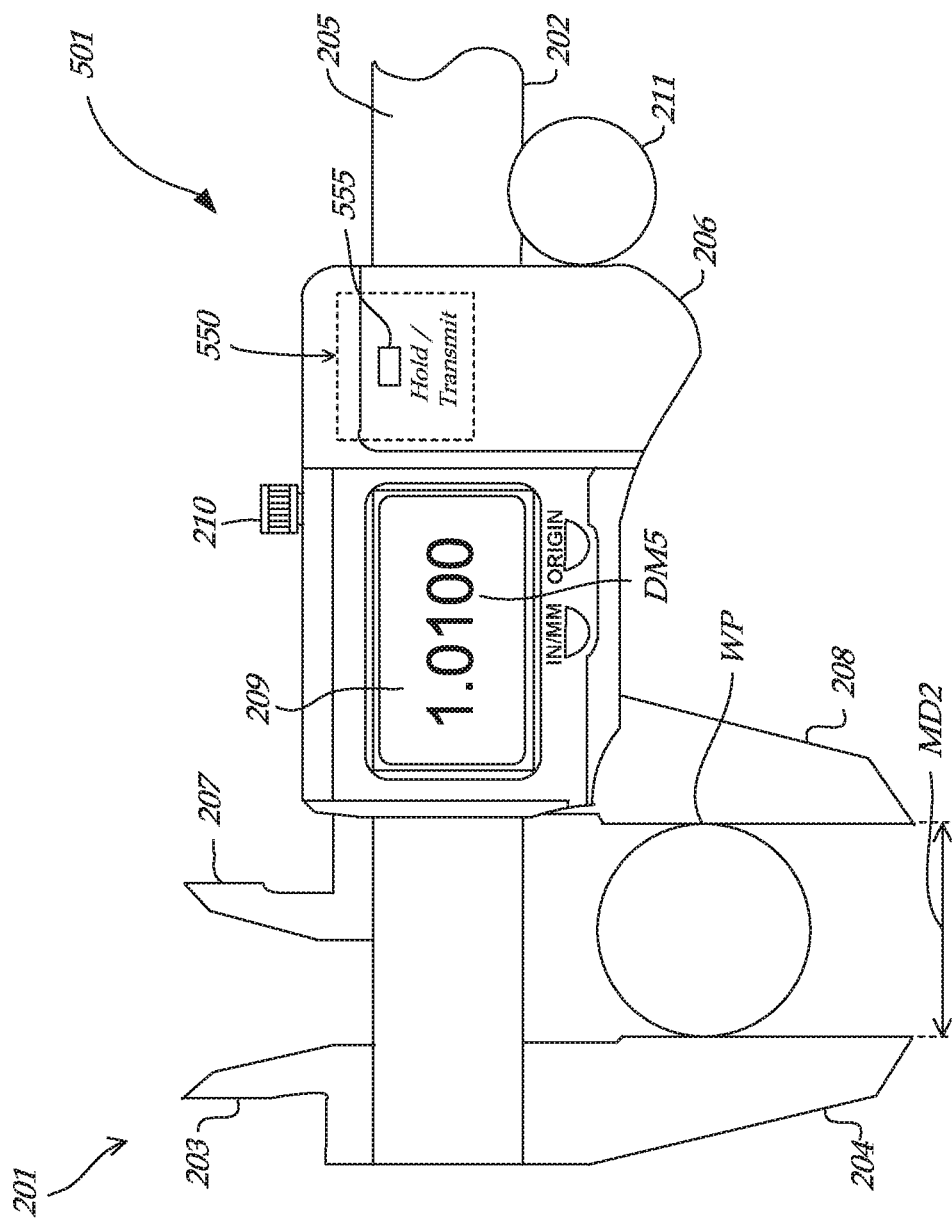
FIG. 5 is a diagram of a front elevation view of a fifth exemplary embodiment of a measurement transmission system as housed in a handheld measuring device for wirelessly transmitting measurement data to a remote system.

FIG. 5 is a diagram of a front elevation view of a fifth exemplary embodiment of a measurement transmission system 550 as housed in a handheld measuring device 501 for wirelessly transmitting measurement data to a remote system. It will be appreciated that the measurement transmission system 550 may have similar characteristics and will be understood to operate similarly to the measurement transmission systems 150, 250, 350 and 450 except as otherwise described below. In contrast to the measurement transmission systems 250, 350 and 450 which include body portions BP as part of removable and portable measurement transmission modules MTM, the measurement transmission system 550 is shown as integrated as part of and housed in the handheld measuring device 501 (e.g., is generally not intended to be removable and attachable to other measuring devices as part of normal operations).

In the example of FIG. 5, the measurement transmission system 550 is illustrated as including a single actuator 555 (e.g., shown as a "hold/transmit" button 555). Thus, similar to as was described above with respect to FIG. 3, in various implementations state-dependent operations may be utilized with respect to the single actuator 555. For example, in one implementation state-dependent operations may function such that a user will operate the actuator 555 once to trigger operations that initiate the data holding state, and then operate the actuator 555 again to trigger the set of operations that includes the transmission cycle of operations and/or to generate energy for performing the data transmission. In operation, similar to the implementation of FIG. 2 as described above, a measured dimension MD5 of a workpiece WP is processed as measurement data to be displayed as a displayed measurement DM5 on the measurement display 209 and/or to be wirelessly transmitted by the measurement transmission system 550 to a remote system (e.g., the remote system 180 of FIG. 1).

Due to the integration of the measurement transmission system 550 in the handheld measuring device 501, in one implementation a power source (e.g., a battery) of the handheld measuring device 501 may be utilized to provide some or all of the energy required for the measurement data transmission. Alternatively, in one implementation an energy generation portion may still be included in the measurement transmission system 550 for providing the energy for the wireless transmission, so as to avoid draining the main battery of the handheld measuring device 501 when the wireless transmission is activated. In various implementations, due to the integration of the measurement transmission system, the measurement display 209 and memory of the handheld measuring device 501 may generally be utilized for any data hold operations (e.g., storing and displaying the frozen measurement data, as well as providing any indications to a user when the measurement data transmission has been successfully completed). In an alternative implementation, separate indicators may be provided on a separate display or otherwise on the outer surface of the measurement transmission system 550.

Figure 6:
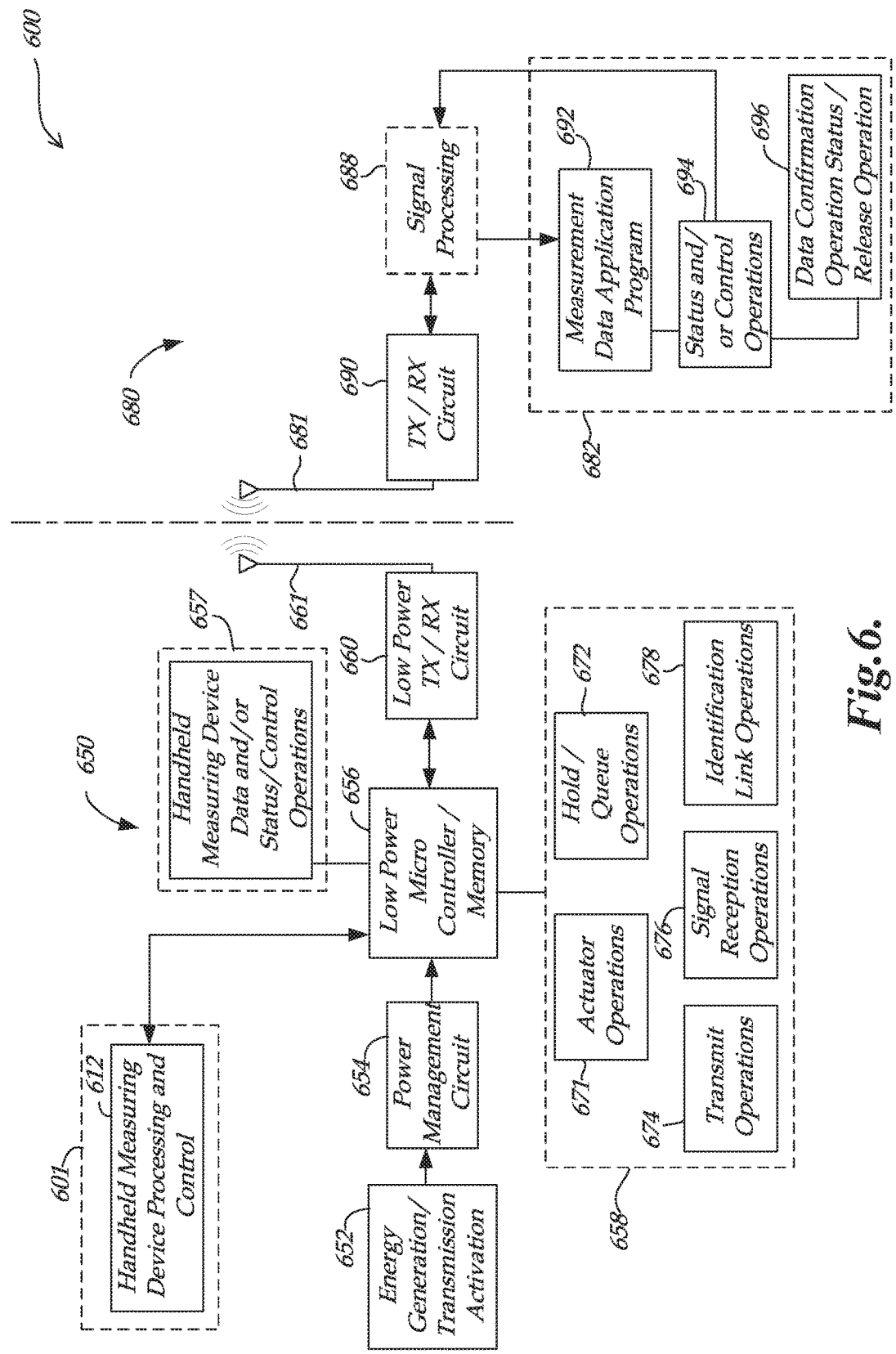
FIG. 6 is a block diagram illustrating an exemplary embodiment of circuit portions of a measurement transmission system, handheld measuring device and remote system.

FIG. 6 is a block diagram illustrating an exemplary embodiment of a measurement system 600 including circuit portions for a measurement transmission system 650, handheld measuring device 601 and remote system 680. It will be appreciated that in various implementations, any or all of the circuit portions of FIG. 6 may be representative of circuit portions of the components of FIGS. 1-5. As shown in FIG. 6, the remote system 680 includes a computer system 682, a signal processing portion 688, a transmitter/receiver circuit 690 and an antenna 681. The computer system 682 includes a measurement data application program 692, status and/or control operations 694 and a data confirmation operation status/release operation 696. In various implementations, the computer system 682 may consist of a type of personal computing device, such as a PC, tablet, smart phone, etc. As described above with respect to FIGS. 1-5, the antenna 681 of the remote system 680 may receive and transmit signals from and to the measurement transmission system 650. For example, the remote system 680 may receive transmitted measurement data, and may transmit a "successful transmission" signal back to the measurement transmission system 650 once the measurement data has been successfully received. As part of the transmitting and receiving operations, the transmitter/receiver circuit 690 may utilize various existing technologies (e.g., a wireless USB transmission unit utilizing a wireless protocol such as Bluetooth, other types of wireless protocol transmitters/receivers, etc.).

In various implementations, the signal processing portion 688 may optionally be included, and may provide various formatting or other functions for converting the raw signals received by the transmitter/receiver circuit 690 into a format for being processed by the measurement data application program 692. As one example, a protocol may be utilized to convert the raw measurement data that is received into measurement values that may be processed by the measurement data application program 692 (e.g., for being inserted in a spreadsheet, etc.). In one implementation, the signal processing portion 688 may remove or otherwise process extraneous information (e.g., header information) from the signals received by the transmitter/receiver circuit 690 (e.g., in particular for extraneous information that is not applicable or needed by the measurement data application program 692). As an alternative to the inclusion of a separate signal processing portion 688, the measurement data application program 692 may be configured to directly process the raw measurement data, identification, etc. signals that are received by the transmitter/receiver circuit 690.

In various implementations, the measurement data application program 692 may be designated to be utilized with one or more specific handheld measuring devices 601 by a manufacturer, vendor, etc. In one implementation, the measurement data application program 692 may include a statistical process control program for receiving measurement data from a handheld measuring device 601, and may include a spreadsheet or other program into which the measurement values represented by the measurement data may be input.

The status and/or control operations 694 may determine and/or otherwise receive signals from the measurement data application program 692 which indicate the status of the processing of recently received measurement data. The data confirmation operation status/release operation 696 may utilize the determined status and indicate when a confirmation and/or release signal should be sent by the status and/or control operations 694 to the signal processing portion 688 for being transmitted back to the measurement transmission system 650. For example, as described above, in one implementation once the transmitted measurement data has been successfully received, the remote system 680 may send a successful transmission signal back to the measurement transmission system 650.

As also illustrated in FIG. 6, the measurement transmission system 650 includes an energy generation/transmission activation portion 652, a power management circuit 654, a low power micro controller/memory 656, a handheld measuring device data and/or status/control operations portion 657, a controller routines portion 658, a low power transmitter/receiver circuit 660 and an antenna 661. In various implementations, various circuit components of the measurement transmission system 650 may correspond to certain components of the measurement transmission systems 150, 250, 350, 450 and/or 550, as described above. For example, in one implementation, the energy generation/transmission activation portion 652 may correspond to the transmission activation portion TAP2 and the energy generation portion EGP2 of FIGS. 2A and 2B. In addition, the circuit components 654-658 may correspond to the circuitry 253A, while the low power transmitter/receiver circuit 660 may correspond to the circuit portion 253B of FIGS. 2A and 2B.

The energy generation/transmission activation portion 652 may in various implementations include a single actuator (e.g., actuator 255) or may include multiple actuators with different separated circuit portions for the energy generation portion and the transmission activation portion. The power management circuit 654 regulates the operation of the circuitry of the measurement transmission system 650 according to the amount of available energy. In various implementations, the power management circuit 654 may accomplish its functions utilizing various voltage regulation and/or voltage detection circuitry for monitoring the remaining energy. For example, in one specific example implementation, the power management circuit 654 may monitor the amount of energy available from an actuation of the energy generation/transmission activation portion 652, and may dictate that the low power micro controller/memory 656 cease operation once the available energy level falls below a certain threshold. Such functions may prevent the low power micro controller/memory 656 from continuing to attempt to operate when energy levels are critically low, which may result in errors. In general, the limited energy produced by one cycle of operation of the energy generation/transmission activation portion 652 may dictate a limited amount of time for which the measurement transmission system 650 may remain active to wait for a successful transmission signal back from the remote system 680 (e.g., in one specific example implementation approximately ten seconds or less).

In various implementations, the low power micro controller/memory 656 may operate as the central controller for the measurement transmission system 650. In various implementations, the functions of the low power micro controller/memory 656 may include processing the measurement data from the handheld measuring device 601 (e.g., as connected through a data port or connection lines), formatting the measurement data for transmission, appending any commands or identifiers to the measurement data as appropriate, outputting the measurement data to the low power transmitter/receiver circuit 660 for transmission to the remote system 680, etc. The handheld measuring device data and/or status/control operations portion 657 may be utilized to facilitate communications between the handheld measuring device 601 and the low power micro controller/memory 656. For example, when a data hold function is required, the handheld measuring device data and/or status/control operations portion 657 may be utilized to determine the proper control signal to be sent to the handheld measuring device processing and control portion 612 for triggering the hold function.

The low power micro controller/memory 656 also interacts with the controller routines portion 658 for performing various operations. The controller routines portion 658 is shown to include actuator operations 671, hold/queue operations 672, transmit operations 674, signal reception operations 676 and identification link operations 678. In various implementations, the actuator operations 671 may be utilized for determining when an actuator has been operated by a user and/or various state dependent operations as described above with respect to FIGS. 1-5. For example, in one example implementation, an actuator may be operated a first time for triggering a hold operation, and then operated a second time for triggering a transmission operation, as may be implemented by the actuator operations 671.

The hold/queue operations 672 may be utilized to implement various data hold functions. For example, the hold/queue operations 672 may be utilized to cause the low power micro controller/memory 656 to store the measurement data internally when a data hold actuator is operated by a user and/or may transmit instructions to the handheld measuring device processing and control portion 612 for storing the measurement data as part of a hold operation that is internal to the handheld measuring device 601. As another example of the hold/queue operations 672, when data holding release operations are to be implemented (e.g., as a result of a successful transmission signal being received from the remote system 680), a signal may be sent by the low power micro controller/memory 656 to the handheld measuring device processing and control portion 612 for terminating the data holding state.

The transmit operations 674 may be utilized for serialization, appending additional information to the measurement data (e.g., device identification, etc.), and/or various formatting or commands for assisting the operation of the measurement data application program 692 of the remote system 680. As one specific example, when the measurement data is being input into a spreadsheet of the measurement data application program 692, the transmit operations 674 may include an "enter" command at the end of the measurement data that is being transmitted. In this manner, the "enter" command may cause the spreadsheet application to move to the next cell after the measurement data is entered, so as to be ready to receive the next transmitted measurement data.

The signal reception operations 676 may be utilized in various implementations for processing signals that are received from the remote system 680 or other systems. For example, as described above, in one implementation the remote system 680 may send a successful transmission signal back to the measurement transmission system 650 once the measurement data has been successfully received by the remote system 680. The signal reception operations 676 may be utilized for decoding or otherwise processing the format of such signals as they may be received from the remote system 680. In addition, in an implementation where the measurement transmission system 650 is required to switch between transmitting and receiving modes, the signal reception operations 676 may assist with the coordination for determining when a transmitting mode and a receiving mode should be active.

The identification link operations 678 may be utilized to include information with the transmitted measurement data that allows the remote system 680 to determine which type of device and/or which of several devices the measurement data is being received from. For example, a remote system 680 may have several handheld measuring devices sending measuring data to it within a given time frame, for which it may be desirable for the remote system 680 to be able to determine which of the handheld measuring devices a current set of measuring data has been received from. In addition, different types of handheld measuring devices may be enabled for sending measuring data (e.g., different types of calipers, gauges, etc.) for which the measuring data may be interpreted or processed differently, for which proper identification of the measuring devices may be needed.

Those skilled in the art will appreciate that the various illustrated circuit portions of the measurement system 600 may generally consist of or be embodied in any types of computing systems or devices. Such computing systems or devices may include one or more processors that execute software to perform the functions described herein. Processors include programmable general-purpose or special-purpose microprocessors, programmable controllers, application-specific integrated circuits (ASICs), programmable logic devices (PLDs), or the like, or a combination of such devices. Software may be stored in memory, such as random access memory (RAM), read-only memory (ROM), flash memory, or the like, or a combination of such components. Software may also be stored in one or more storage devices, such as magnetic or optical-based disks, flash memory devices, or any other type of non-volatile storage medium for storing data. Software may include one or more program modules that include routines, programs, objects, components, data structures, and so on that perform particular tasks or implement particular abstract data types. In distributed computing environments, the functionality of the program modules may be combined or distributed across multiple computing systems or devices and accessed via service calls, either in a wired or wireless configuration.

The problem solutions and related principles disclosed below with reference to FIGS. 7-11 are somewhat different than those disclosed above with reference to FIGS. 1-6. The preceding description of FIGS. 1-6 discloses various combinations of elements, principles and operations that may be used in various implementations of a measurement transmission module that may be connected to a battery-powered portable measuring device and wirelessly transmit measurement data obtained from the portable measuring device to a remote data node based substantially or solely on power generated by a user. In particular, the user may actuate a miniature mechanical energy generator on the module (e.g., integrated with a button pressed by the user to trigger transmitting the measurement data.) Accordingly, the wireless data transmission need not use any battery power from the battery-powered portable measuring device.

However, while the preceding description enables wireless data transmission without draining the battery resources of the battery-powered portable measuring device, it requires manual actuation by a user and therefore problematically limits the utility of the measurement transmission module.

In order to provide good utility and good value, ideally a wireless transmission module should be compatible with the widest possible assortment of battery-powered portable measuring devices. Some such devices may not be handheld, rendering the previously disclosed energy generating actuator useless for such devices. For example, certain known battery powered position-measurement scales use battery powered caliper readhead and scale components adapted to mounting on a drill press or lathe or the like, to measure and display displacements on the machine. In some applications it may be desirable to mount such measurement scale components under or behind a machine, and continuously transmit their measurements to a freely positionable "remote" display. In such a case a wireless transmission module that requires button pushing is impractical. Conversely, the battery (or wire) powered wireless transmission attachments that are currently available to interface to such scales and allow mounting in inconvenient locations are bulky, and require inconvenient battery changes or permanent power wiring in an inconvenient installation location. Furthermore, such existing data transmitting devices are ergonomically unwieldy and not widely accepted for use on handheld battery-powered portable measuring devices.

It should be appreciated that there is considerable user resistance to changing batteries in battery-powered portable measuring devices, and the like. Presently, many such devices may operate for years with one small button or coin cell type battery less than 12 millimeters in diameter. Longer battery life is a desirable feature. Devices often go unused after their battery runs down (much as with watches, or the like). The same user resistance to changing batteries may be expected for a desirable wireless data transmission module.

Based on the foregoing discussion, it will be appreciated that it would be desirable for a wireless data transmission module to operate and provide measurement data more or less continuously, without the need for battery power or manual actuation. It would be desirable for a wireless data transmission module to be capable of responding to a remote request for measurement data from a remote data node, and/or simply automatically or semi-automatically transmit measurement data when such a remote data node is in the vicinity of the wireless data transmission module. It would be desirable for the wireless data transmission module to be compact, lightweight, and ergonomically compatible and easy to use with a variety of handheld battery-powered portable measuring devices, as well as being operable with inconveniently located machine-mounted battery powered measuring devices. It would be desirable for the wireless data transmission module to work over a range of convenient distances from the remote data node. It would be desirable to activate or transmit a measurement without an inadvertent hand position change or exertion due to pressing a button, which may cause a user to erroneously disturb the measurement position of the measurement device.

The combination of features in various system implementations and related principles disclosed below with reference to FIGS. 7-11 provide all of the desirable features outlined above. A data transmission module is provided for inputting measurement data from a battery-powered portable measuring device and wirelessly transmitting corresponding measurement data signals to a remote data node, based substantially or solely on harvesting and/or using wireless power from the remote data node, and without using battery power from the battery-powered portable measuring device. Generally speaking, various existing general purpose wireless power harvesting and data communication solutions are bulkier and/or more power intensive than is desirable or acceptable for optional or "retrofit" use with existing handheld battery-powered portable measuring devices. Some existing wireless power harvesting and data communication solutions used in medical are small enough, but do not have an appropriate and convenient power harvesting range. The wireless data transmission module implementations disclosed below overcome these problems.

Figure 7:
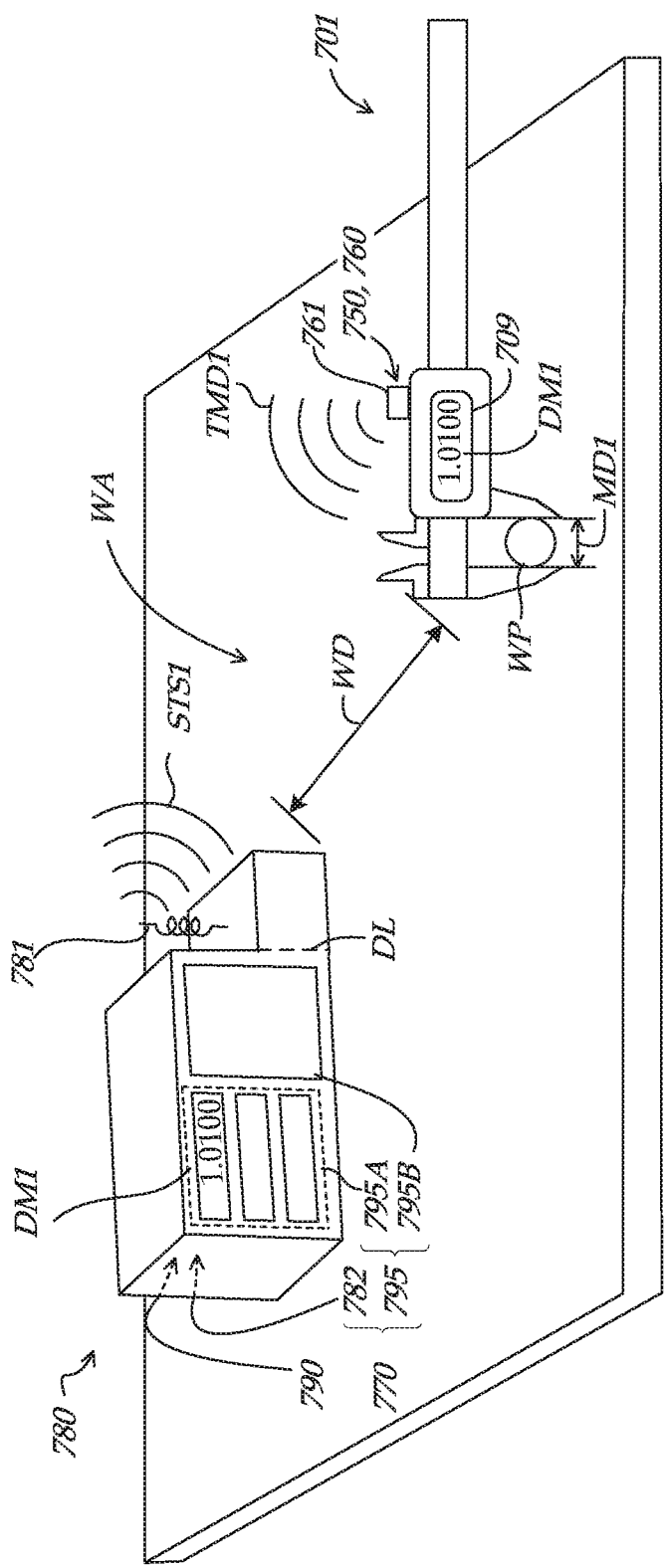
FIG. 7 is a block diagram of a sixth exemplary implementation of a data transmission module as coupled to a battery-powered portable measuring device and as wirelessly communicating measurement data to a remote data node.

FIG. 7 is a block diagram of a sixth exemplary implementation of a data transmission module 750 as coupled to a battery-powered portable measuring device 701 and as wirelessly communicating transmitted measurement data TMD1 from the battery-powered portable measuring device 701 to a remote data node 780, across a working distance WD situated in a working area WA (e.g., an area the size of a metrology station working surface, or desk, or an industrial work "work cell", or the like.) In various implementations, wireless devices within the working area WA may be said to participate in a "personal metrology network." The transmitted measurement data TMD1 may be related to one or more measurements (e.g., a measured dimension MD1) of a workpiece WP taken with the battery-powered portable measuring device 701. The remote data node 780 may include a field generator/receiver 781 connected to a generator/receiver circuit 790, and a remote device interface and circuits portion 770, which may include various operating circuits and routines 782, and a user interface 795.

In one implementation, the user interface 795 may include a measurement display 795A and touchscreen 795B for displaying text and/or control elements, and the like. The operating circuits and routines 782 may be implemented in a processor and memory, to implement various operations similar to those previously outlined with reference to the measurement data application program 692, the status and/or control operations 694 and the data confirmation operation status/release operation 696, as implemented in the computer system 682 with reference to FIG. 6, and/or other operations as disclosed herein or otherwise desired.

The field generator/receiver 781 and the generator/receiver circuit 790 may be implemented as described in greater detail below, with reference to FIGS. 8A-8C. Generally speaking, they are configured to generate at least one energy supply field STS1 (e.g., for providing power to the data transmission module) and to wirelessly receive the measurement data signals from the data transmission module 750.

A representation of the measurement data from the battery-powered portable measuring device 701 may be displayed as a displayed measurement DM1 on a self-contained display 709 of the battery-powered portable measuring device 701 and/or on the user interface (e.g., display) 795 of the remote data node 780.

In various implementations, the data transmission module 750 may be provided as a battery-less accessory for attachment to the battery-powered portable measuring device 701. In various implementations, the data transmission module includes a body portion (described further below), a field receiver/wireless data generator 761, and a data transmission and energy manager circuit 760. The field receiver/wireless data generator 761 and the data transmission and energy manager circuit 760 may be implemented as described in greater detail below, with reference to FIGS. 8A-8C. The body portion is configured to physically couple to the battery-powered portable measuring device 701. The field receiver/wireless data generator 761 is configured to receive the energy supply field STS1 from the remote data node 780. Generally speaking, the field receiver/wireless data generator 761 may be coupled to a transmitter circuit included in the data transmission and energy manager circuit 760, in order to wirelessly communicate the measurement data signals to the remote data node 780, as described in greater detail below. The data transmission and energy manager circuit 760 includes a data connector configured to couple to a data connector on the battery-powered portable measuring device 701. The measurement data from the battery-powered portable measuring device 701 may be input through the data connector, and the measurement data signals TMD1 corresponding to the input measurement data may be wirelessly transmitted to the remote data node 780 using the field receiver/wireless data generator 761.

In various implementations, the battery-powered portable measuring device 701 may be powered by a battery that is not part of the data transmission module 750 and that is not connected as a power supply to the data transmission module 750, and is configured to operate and display the measurement data on a self-contained display 709, regardless of whether battery-powered portable measuring device 701 is coupled to the data transmission module 750. In various implementations, the field receiver/wireless data generator 761 may be configured to wirelessly transmit the measurement data signals to the remote data node 780 using only a) the harvested energy or b) a modulated reflection of, or coupling to, the received energy supply field STS1 from the remote data node 780, or c) a combination of a) and b)—as described in greater detail below.

In various implementations, various protocols related to holding, transmitting, and receiving measurement data, as well as related commands and the like, may be implemented as previously outlined herein, or as desired, according to known methods.

In various implementations, the system outlined above may be configured to use a relatively small and ergonomically practical field receiver/wireless data generator 761. When the battery-powered portable measuring device 701 and data transmission module 750 are relatively close to the remote data node 780 (e.g., at a working distance of approximately 1-2 meters, or so, in a typically used working area WA), sufficient power (e.g., approximately 10 microwatts, etc.) may still be provided to the data transmission module 750, and the system may operate according to various principles disclosed herein. Advantageous energy harvesting and data transmission components and techniques are described below.

FIGS. 8A-8C are block diagrams illustrating exemplary implementations of various modes of energy supply field coupling and data transmission between data transmission modules 850A-850C, and remote data nodes 880A-880C, respectively.

FIG. 8A shows a remote data node 880A and a data transmission module 850A. It will be appreciated that certain numbered components of FIG. 8A may correspond to and/or have similar operations as similarly numbered components in FIG. 7 (e.g., components having the same XX number suffix such 7XX and 8XX), and may generally be understood by analogy except as otherwise described below.

The remote data node 880A includes a field generator/receiver 881A coupled to a generator/receiver circuit 890A, which is coupled to a processor 888A, which is coupled to a remote device interface and circuits portion 870A. The data transmission module 850A includes a field receiver/wireless data generator 861A coupled to a data transmission and energy manager circuit 860A.

In the implementation shown in FIG. 8A, the field generator/receiver 881A and the field receiver/wireless data generator 861A may be electrical loop antennas, and the energy supply field (as represented by the power transmission P1) generated by the field generator/receiver 881A may be an oscillating magnetic field which inductively couples to (is received by) the field receiver/wireless data generator 861A. Such inductive coupling may be implemented according to known methods, as known in the art of RFID systems, for example (e.g., as described at http://rfid-handbook.de/about-rfid.html.)

In various implementations the field generator/receiver 881A as connected to the matching circuit 891A, and the field receiver/wireless data generator 861A as connected to the matching circuit 863A, may comprise form resonant circuits as part of a resonant inductive coupling configuration, which may be implemented according to known principles. For example, various electrical loop antennas, and impedance matching and/or resonant circuits useful in the matching circuits 863A and 891A, may be implemented according to principles disclosed in U.S. Pat. Nos. 8,035,255, 9,246,358, 8,076,801, 8,035,255, and/or 7,271,677, each of which is hereby incorporated herein by reference in its entirety. Such resonant inductive coupling may greatly increase coupling and power transfer (e.g., approximately 10-1,000 times, in various implementations) relative to non-resonant inductive coupling configurations. Regarding the generator/receiver circuit 890A in the remote data node 880A, in the illustrated implementation it includes the matching circuit 891A, a supply/transmit circuit 894A and a receiver circuit 893A. Such circuits may be implemented according to known principles, for example, as described in the previously incorporated references, and therefore will be described only briefly here.

Briefly, the matching circuit 891A may be configured to provide a desired impedance and/or tune the resonant frequency of the field generator/receiver 881A. The supply/transmit circuit 894A and the receiver circuit 893A may be connected to the field generator/receiver 881A through the matching circuit 891A. The supply/transmit circuit 894A is configured to drive an oscillating magnetic field (e.g., at the resonant frequency, for transmitting power P1) which may inductively couple to (be received by) the field receiver/wireless data generator 861A. As described in greater detail below, the impedance (or load) of the field receiver/wireless data generator 861A may be modulated by the data transmission and energy manager circuit 860A, in order for the data transmission module 850A to transmit data (see MLOAD2 in FIG. 8A). The receiver circuit 893A may detect the modulated impedance MLOAD2 of the field generator/receiver 881A. By way of brief explanation, the field receiver/wireless data generator 861A inductively loads (draws energy from) the oscillating magnetic field. The receiver circuit 893A may monitor the modulated load impedance, for example, by monitoring a voltage drop across an internal resistance of the circuit driving the field generator/receiver 881A, as schematically represented in FIG. 8A. In one known implementation, the receiver circuit 893A may demodulate the monitored AC voltage across the internal resistance, and detect variations in the demodulated signal, which constitute transmitted data.

As schematically illustrated in the implementation shown in FIG. 8A, the supply/transmit circuit 894A may also be configured to modulate the drive amplitude of the oscillating magnetic field, under control of the processor 888A, in order to transmit data. The modulated amplitude of the oscillating magnetic field received by the field receiver/wireless data generator 861A may be detected by the receiver circuit 867A of the data transmission and energy manager circuit 860A, as described in greater detail below.

By analogy with the previously described remote device interface and circuits portion 770, the remote device interface and circuits portion 870A may include similar elements, which may be implemented in cooperation with the processor 888A.

In the data transmission module 850A, regarding the data transmission and energy manager circuit 860A, in the illustrated implementation it includes the matching circuit 863A, a power harvester circuit 864A, a receiver circuit 867A, an energy storage device 862A, a processor/memory 866A, a data connector 868A, and a transmitter circuit 865A. Such circuits may be implemented according to known principles, for example, as described in the previously incorporated references, and therefore will be described only briefly here.

Briefly, the matching circuit 863A may be configured to provide a desired impedance and/or tune the resonant frequency of the field receiver/wireless data generator 861A, according to previously outlined principles. The power harvester circuit 864A and the receiver circuit 867A may be connected to the field receiver/wireless data generator 861A through the matching circuit 891A. The power harvester circuit 864A is configured to rectify and boost a voltage derived from a current in the field receiver/wireless data generator 861A due to the oscillating magnetic field (e.g., as disclosed in the previously incorporated references). The energy storage device 862A (e.g., a supercapacitor, or the like) is connected to the power harvester circuit 864A, and is charged by its output voltage, and provides power to various elements of the data transmission module 850A.

Regarding the transmitter circuit 865A, as schematically illustrated in the implementation shown in FIG. 8A, the transmitter circuit 865A may modulate the impedance (or load) of the field receiver/wireless data generator 861A, in order for the data transmission module 850A to transmit data (see MLOAD2 in FIG. 8A). In one implementation, the processor/memory may receive measurement data from the battery-powered portable measuring device 701 through the data connector 868A, and operate the transmitter circuit 865A to modulate the impedance of the field receiver/wireless data generator 861A, in order to transmit the measurement data (e.g., according to principles outlined above with reference to the receiver circuit 893A of the remote data node 880A.) In one embodiment, the transmitter circuit 865A modulates the impedance of the field receiver/wireless data generator 861A using a processor-controlled transistor to alter (e.g., short out) its internal impedance, as schematically illustrated in FIG. 8A.

Regarding the receiver circuit 867A, when the remote data node 880A is operated to modulate the drive amplitude of the oscillating magnetic field in order to transmit data, the receiver circuit 867A may monitor the resulting modulated amplitude, for example, by monitoring a voltage drop across a test resistance in the receiver circuit 867A. In one known implementation, the receiver circuit 867A may demodulate the monitored AC voltage across the test resistance, and detect variations in the demodulated signal, which constitute transmitted data.

The processor/memory 866A may be connected as illustrated or implied herein, to receive and provide various signals, and operate as outlined herein. It may also incorporate, or be connected to, module circuit/operations 858A in order to implement associated operations. The module circuit/operations 858A may include circuits or routines usable to implement various operations similar to those previously outlined with reference to actuator operations 671, hold/queue operations 672, transmit operations 674, signal reception operations 676 and identification link operations 678 as implemented in the controller routines portion 658, as previously outlined with reference to FIG. 6.

FIG. 8B shows a remote data node 880B and a data transmission module 850B. It will be appreciated that certain numbered components of FIG. 8B may correspond to and/or have similar operations as similarly numbered components FIG. 8A, and may generally be understood by analogy except as otherwise described below. Therefore, only significant differences are emphasized in the following description. The remote data node 880B includes a field generator/receiver 881B coupled to a generator/receiver circuit 890B. The data transmission module 850B includes a field receiver/wireless data generator 861B coupled to a data transmission and energy manager circuit 860B.

In the implementation shown in FIG. 8B, the field generator/receiver 881B and the field receiver/wireless data generator 861B may be RF antennas (e.g., dipole antennas, strip antennas, metallic "tag" antennas as used in RFID components, or the like). In general, the field generator/receiver 881B is not restricted in size, and may comprise any desirable antenna design for the purpose of transmitting a desired level of power to the field receiver/wireless data generator 861B. In contrast, the field receiver/wireless data generator 861B is desired to be relatively compact, and compatible with ergonomic design of the data transmission module 850B. The energy supply field (as represented by the power transmission P1) generated by the field generator/receiver 881B may include desired RF or UHF frequencies of electromagnetic radiation, or both, in various implementations. The radiation is received by the field receiver/wireless data generator 861B. Such coupling may be implemented according to known methods, as known in the art of RFID systems, for example (e.g., as described at http://rfid-handbook.de/about-rfid.html.) Various suitable antennas and related circuits referred to below may be implemented according to principles disclosed in the previously incorporated references, as well in U.S. Pat. Nos. 7,084,605, 8,963,781, and/or 9,159,017, each of which is hereby incorporated herein by reference in its entirety. Additional reference may be made to "Wireless Passive Sensor Networks," Ozgur Akan, et al., IEEE Communications Magazine, August 2009, and/or "Design of an RFID-Based Battery-Free Programmable Sensing Platform," Alanson Sample, et al., IEEE Transactions on Instrumentation and Measurement, Vol. 57, No. 11, November 2008, for example.

Regarding the generator/receiver circuit 890B in the remote data node 880B, differences compared to the generator/receiver circuit 890A are related to the RF antenna use outlined above. It includes circuits analogous to those of generator/receiver circuit 890A, as well as a directional coupler 892B, which connects the receiver 893B and the supply/transmit circuit 894B to the field generator/receiver 881B through the matching circuit 891B (which may be optional in some implementations). Such circuits may be implemented according to known principles, for example, as described in the previously incorporated references, and therefore will be described only briefly here.

The supply/transmit circuit 894B drives the field generator/receiver 881B through the directional coupler 892B, to generate the radiated field (e.g., for transmitting power P1) which may be received by the field receiver/wireless data generator 861B. As described in greater detail below, the impedance of the field receiver/wireless data generator 861B may be modulated by the data transmission and energy manager circuit 860B, in order for the data transmission module 850B to transmit data (see MP2 in FIG. 8B). The receiver 893B may detect that impedance modulation. By way of brief explanation, the aforesaid impedance modulation affects (modulates) the reflected power MP2 received by the field generator/receiver 881B, according to known principles of backscatter coupling. In some implementations, the field receiver/wireless data generator 861B and the matching circuit 863B may be configured to be in resonance with the radiated wavefront from the field generator/receiver 881B, so as to provide a relatively large reflection cross-section. The receiver 893A may monitor the reflected power MP2 through the directional coupler 892B according to known methods. For example, the ratio of the power P1 transmitted by the field generator/receiver 881B to the reflected power MP2 can be estimated using the "radar equation" and known circuit techniques. Variations in this ratio constitute transmitted data.

Other elements shown in FIG. 8B may generally be understood to provide operations analogous to their counterparts in FIG. 8A, and may generally be understood based on the previous description. Any necessary adaptations may be recognized by one of ordinary skill in that art, and/or based on the previously incorporated references, or the like.

FIG. 8C shows a remote data node 880C and a data transmission module 850C. It will be appreciated that certain numbered components of FIG. 8C may correspond to and/or have similar operations as similarly numbered components in FIGS. 8A and/or 8B, and may generally be understood by analogy except as otherwise described below. Therefore, only significant differences are emphasized in the following description. The remote data node 880C includes a field generator 881C and field receiver 881C', coupled to a generator/receiver circuit 890C. The data transmission module 850C includes a field receiver 861C and a wireless data generator 861C' coupled to a data transmission and energy manager circuit 860C.

In the implementation shown in FIG. 8C, the field generator 881C and the field receiver 861C may be electric loops, and their attached components and operation may be understood by analogy to FIG. 8A, except that they are used solely for the purpose of energy transmission and harvesting in this particular implementation of the data transmission module 850C, therefore the receiver circuit is not include therein. The field receiver 881C' and the wireless data generator 861C' may be RF or UHF antennas, and data may be transmitted therebetween using conventional methods, using only harvested power, and/or stored energy from the energy storage device 852C, to do so. The system implementation of FIG. 8C may be suitable for providing a continuous display of measurement readings from the data transmission module 850C and the attached measurement device, for example.

It should be appreciated that for the configuration of the system shown in FIG. 8C, the elements 880Ct and 880Cr may be physically separated if desired (e.g., at the dashed line DL shown in FIG. 7, on the remote data node 780). They may have separate power supplies in some implementations, or may be connected by a power and signal connection in other implementations. In either case, they may be separately located around a work area (e.g., the work area WA shown in FIG. 7), for convenience and/or to enhance wirelessly connectivity around obstacles, or the like.

Figure 9A:
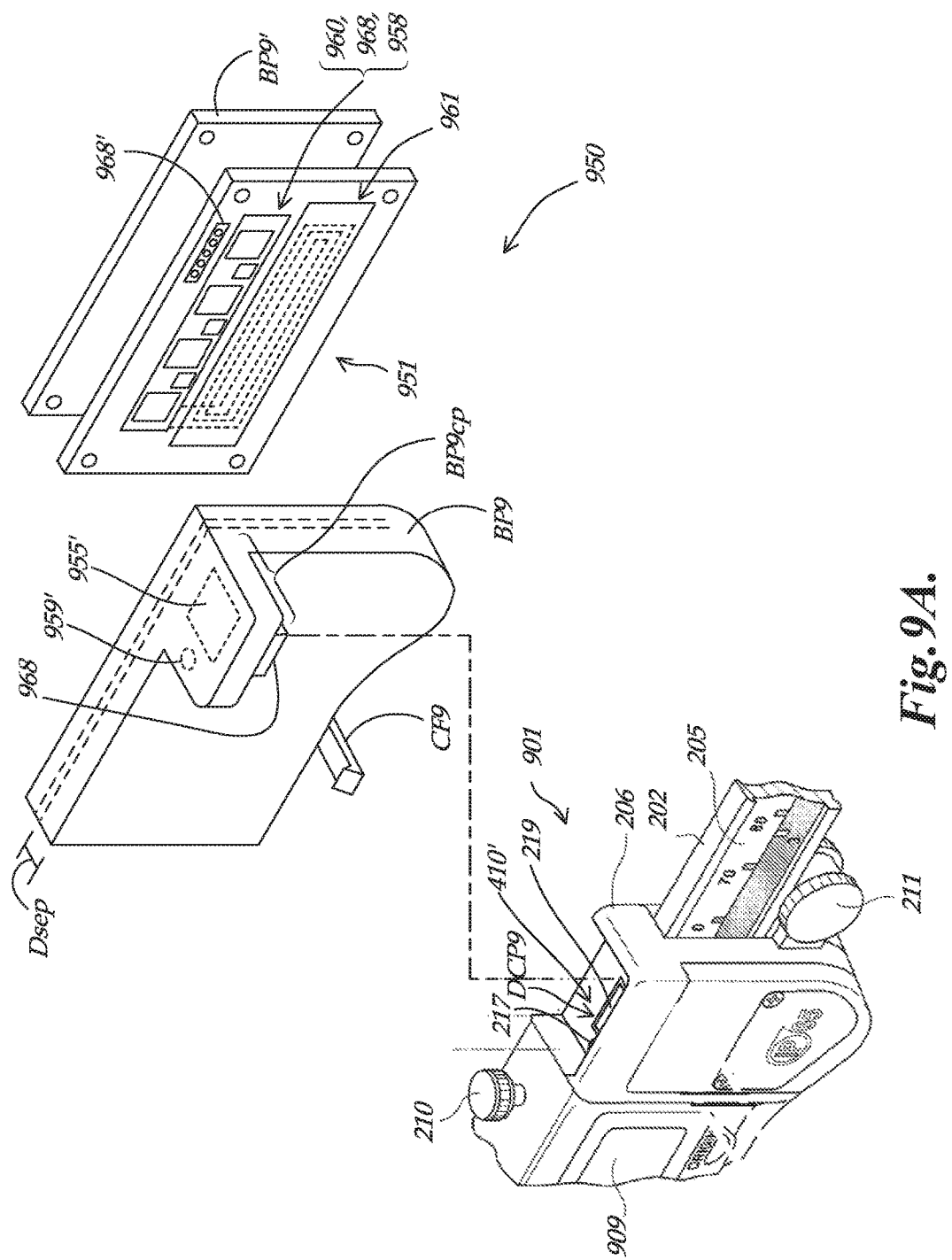
FIG. 9A is a diagram of a perspective view of a seventh exemplary implementation of a data transmission module.

FIG. 9A is a partly representational partly schematic diagram of a perspective view of a seventh exemplary implementation of a data transmission module 950 as coupled to a battery-powered portable measuring device 901 for wirelessly transmitting measurement data to a remote data node (e.g., the remote data node 780 of FIG. 7). It will be appreciated that certain numbered components of FIG. 9A may correspond to and/or have similar functions as similarly or identically numbered components in FIGS. 7, 8A-8C and FIG. 4, and may generally be understood by analogy except as otherwise described below. Therefore, only significant differences are emphasized in the following description. The data transmission module 950 includes a body portion BP9, a circuit board assembly 951 that mounts inside the body portion BP9 (approximately as indicate by dashed lines), and a cover BP9'. The body portion BP9 is shown to include a representative coupling feature CF9 (which may be one of various other known types of included mechanical coupling features not shown), which may mechanically couple to a mating feature on the slider 206 to fix the data transmission module 950 to the battery-powered portable measuring device 901, according to previously outlined principles. A region BP9cp of the body portion BP9 may be recognized as a connector region, which may have dimensions and connection features which are similar or identical to corresponding features of the body portion BP4 of the module MTM4 shown in FIG. 4, to the extent that they are compatible with the general description below. Although the body portion BP9 has a considerable different size and shape compared to the body portion BP4 shown in FIG. 4, for the primary purpose of allowing a larger volume to house a relatively large field receiver/wireless data generator 961, it provides substantially similar functions. The purpose of the relatively large field receiver/wireless data generator 961 is to allow greater power transfer and energy harvesting from the remote data node (e.g., the remote data node 780 of FIG. 7), which is generally enhanced by a relatively large field receiver/wireless data generator 961. However, in some implementations configured for exceptionally efficient power harvesting, and/or designated for working at a compatible shorter working distance WD (see WD, FIG. 7), the relatively large field receiver/wireless data generator 961 and the circuit board assembly 951 may be adapted for use in a body portion comparable to the body portion BP4, if desired.

In various implementations such as that shown in FIG. 9A, it may be ergonomically desirable to shape the body portion similarly to the body of the part that it couples to (e.g., the slider (readhead) 206), in a manner similar to that illustrated for the body portion BP9 in FIG. 9A. In various implementations, the body portion BP9 of the data transmission module 950 may be configured to physically couple to the battery-powered portable measuring device 901 such that a majority of the volume of the data transmission module 950 is located at the back portion of the battery-powered portable measuring device 901 (e.g., the back portion being on an opposite side of the battery-powered portable measuring device 901 than the self-contained display 909 that is on a front portion of the battery-powered portable measuring device 901, etc.). In addition, the relatively large field receiver/wireless data generator 961 may be arranged in the volume that is located at the back of the battery-powered portable measuring device 901 when the data transmission module 950 is physically coupled to the battery-powered portable measuring device 901. In various implementations, the circuit board assembly 951 carrying the relatively large field receiver/wireless data generator 961 may be mounted in the body portion BP9 so as to provide a desirable separation Dsep between it and the back of the battery-powered portable measuring device 901, which may generally enhance its ability to efficiently receive the energy supply field form the remote data node, especially when the back is fabricated of metal. Related considerations are addressed in some of the incorporated references. In some implementations Dsep is at least 2 millimeters, or 4 millimeters, or more, subject to the limitations of ergonomic design for the body portion BP9.

As shown in FIG. 9A, in some implementations the data transmission module 950 may optionally include a low power actuator 955' and/or a harvesting indicator 959'. In contrast to the actuator 455, the low power actuator 955' generates no energy, and dissipates as little energy as possible. However, otherwise it activates operations and protocols similar to those associated with actuators previously disclosed herein. The harvesting indicator 959' similarly dissipates as little energy as possible, and may indicate to a user whether the current power harvesting and/or energy storage are at an operational level in the data transmission module 950 (e.g., whether the device is in or out of an operations working distance WD, relative to a remote data node.

The circuit board assembly 951 is shown to include the relatively large field receiver/wireless data generator 961, which is connected to the data transmission and energy manager circuit 960. The data transmission and energy manager circuit 960 may incorporate a module circuit/operations portion 958 in order to implement associated operations, all as previously outlined with reference to corresponding elements in FIGS. 8A-8C. The data transmission and energy manager circuit 960 is also shown to include a data connector element 968' which, when installed, is connected and/or integrated with a data connector 968 in the connector region BP9cp of the body portion BP9, by known methods. Generally, any of the various configurations of the data transmission modules 850A-850C may be implemented in the data transmission module 950. It will be appreciated that the illustrated and described implementation of the data transmission module 950 is exemplary only, and not limiting. More generally, any of the various features or configurations of the data transmission modules 850A-850C may be implemented in a data transmission module in any desired operable combination, using a variety of known fabrications and assembly methods, according to the principles disclosed herein.

Figure 9B:
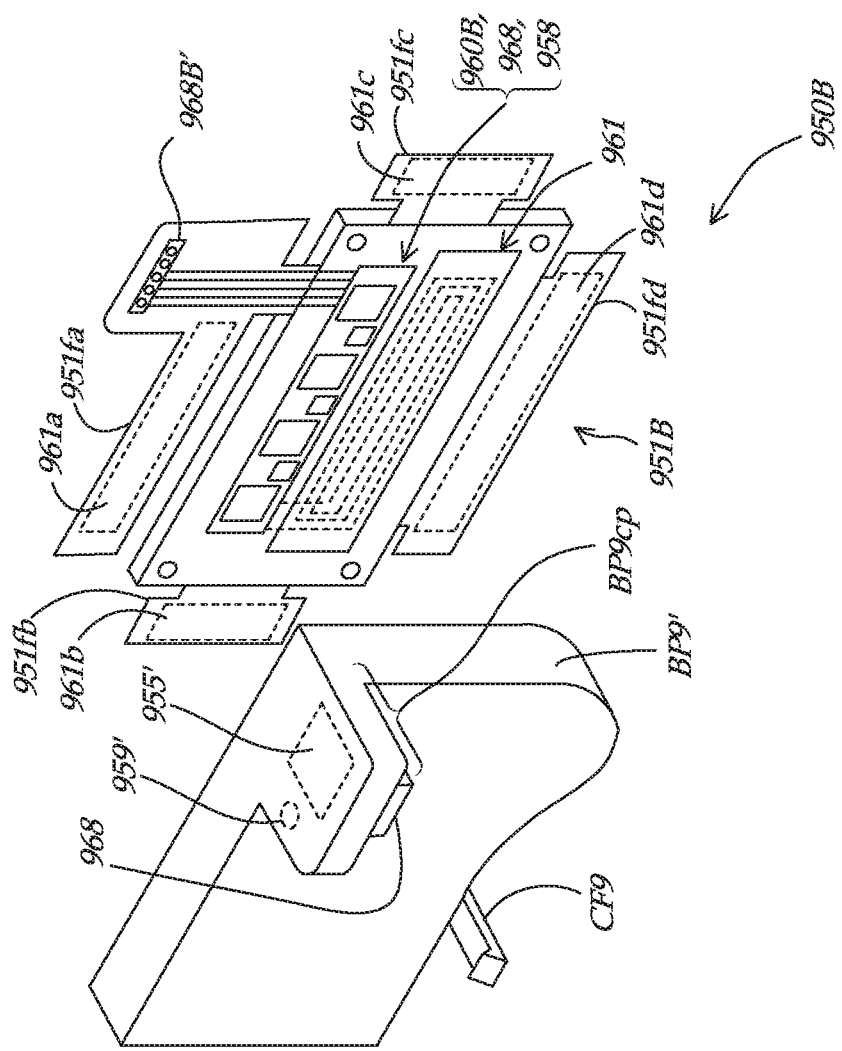
FIG. 9B is a diagram of a perspective view of an eighth exemplary implementation of a data transmission module.

FIG. 9B is a partly representational partly schematic diagram of a perspective view illustrating certain portions of an eighth exemplary implementation of a data transmission module 950B. It will be appreciated that certain numbered components of FIG. 9B may correspond to and/or have similar functions as similarly or identically numbered components in FIG. 9A, and may generally be understood by analogy except as otherwise described below. Therefore, only significant differences are emphasized in the following description.

The data transmission module 950B includes a body portion BP9' which may be adapted according to known methods (in comparison to the body portion BP9) to accommodate the circuit board assembly 951B. In comparison to the circuit board assembly 951 shown in FIG. 9A, the circuit board assembly 951B may be a known type of "rigid flex" assembly, including one or more of the tab portions 951a-951d. The tab portions may accommodate a corresponding one or more additional field receiver/wireless data generators 961a-961d. The tab portions may be folded approximately 90 degrees toward the body portion BP9' prior to assembly into the body portion BP9'. Each additional field receiver/wireless data generators 961a-961d may have an appropriate matching circuit (e.g., one of the matching circuits 863A-863C described previously), which may be incorporated into the data transmission and energy manager circuit 960B according to known methods (e.g., as disclosed in the incorporated references).

The configuration disclosed in FIG. 9B may be advantageous in that it may allow greater power transfer and energy harvesting from the remote data node (e.g., the remote data node 780 of FIG. 7), due to the field receiving area added by the additional field receiver/wireless data generators 961a-961d. It may also improve the power harvesting for unpredictable operating orientations, due to the 3-D arrangement of the various field receiver/wireless data generators 961 and 961a-961d.

It was indicated above with reference to FIG. 9A that in some implementations configured for exceptionally efficient power harvesting, and/or designated for working at a compatible shorter working distance WD (see WD, FIG. 7), the relatively large field receiver/wireless data generator 961 and the circuit board assembly 951 may be adapted for use in a body portion comparable to the body portion BP4, if desired. Due to the additional field receiving area and 3-D arrangement of the configuration illustrated in FIG. 9B, adapting it for use in a body portion comparable to the body portion BP4 may be particularly advantageous.

Figure 10:
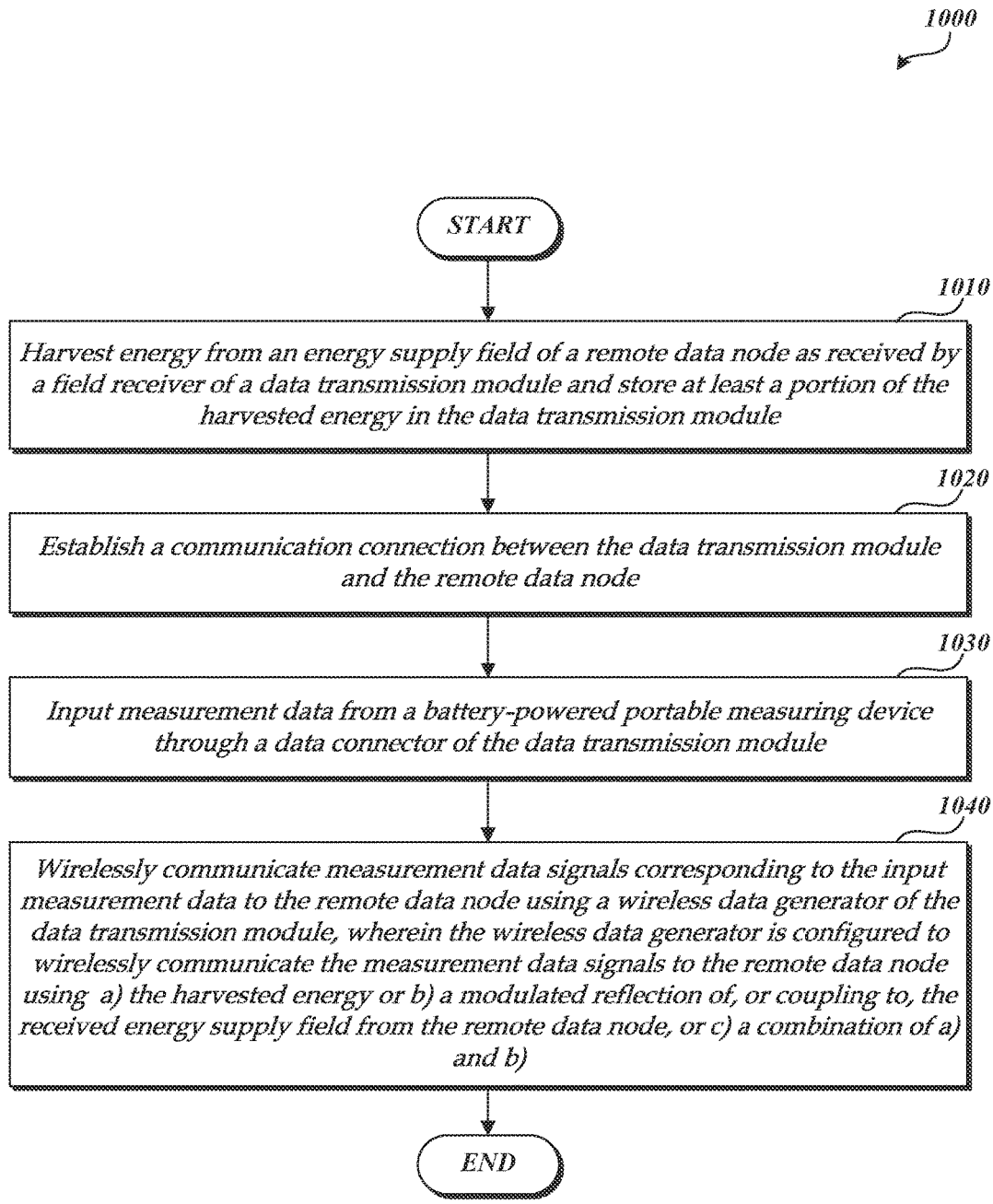
FIG. 10 is a flow diagram illustrating one exemplary implementation of a routine for utilizing a data transmission module to wirelessly transmit measurement data signals from a battery-powered portable measuring device to a remote data node.

FIG. 10 is a flow diagram illustrating one exemplary implementation of a routine 1000 for utilizing a data transmission module to wirelessly communicate measurement data signals from a battery-powered portable measuring device to a remote data node. At a block 1010, energy is harvested from an energy supply field of a remote data node as received by a field receiver of a data transmission module and at least a portion of the harvested energy is stored in the data transmission module. At a block 1020, a communication connection is established between the data transmission module and the remote data node. In various implementations, the establishment of the communication connection may be initiated based on a certain amount of energy having been harvested in the data transmission module as received from the remote data node. For example, the data transmission module may primarily be inactive when it is not within a certain proximity (e.g., 1 meter, etc.) of a remote data node, but may include functions for "waking up" and becoming active once it is within such a proximity and energy begins to be harvested as received from the remote data node. As part of such processes, a communication connection may be established as the data transmission module senses that it is within the certain distance and/or is otherwise receiving energy from the remote data node. In various implementations, the communication connection may be established by sending a certain type of communication connection code and/or measurement data, etc.

At a block 1030, measurement data is input from a battery-powered portable measuring device through a data connector of the data transmission module. At a block 1040, measurement data signals corresponding to the input measurement data are wirelessly communicated to the remote data node using a wireless data generator of the data transmission module and the wireless data generator is configured to wirelessly communicate the measurement data signals to the remote data node using (a) the harvested energy, or (b) a modulated reflection of, or coupling to, the received energy supply field from the remote data node, or (c) a combination of (a) and (b). In various implementations, the wireless data generator may be configured to use primarily or only (a), (b) or (c) to wirelessly communicate the measurement data signals to the remote data node.

While preferred implementations of the present disclosure have been illustrated and described, numerous variations in the illustrated and described arrangements of features and sequences of operations will be apparent to one skilled in the art based on this disclosure. Various alternative shapes and forms may be used to implement the principles disclosed herein. In addition, the various implementations described above can be combined to provide further implementations. All of the U.S. patents and U.S. patent applications referred to in this specification are incorporated herein by reference, in their entirety. Aspects of the implementations can be modified, if necessary to employ concepts of the various patents and applications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled.

What is claimed is:

1. A data transmission module for inputting measurement data from a battery-powered portable measuring device and wirelessly communicating corresponding measurement data signals to a remote data node which is configured to generate at least one energy supply field and wirelessly receive the measurement data signals from the data transmission module, the data transmission module comprising:

a body portion including a data connector which is configured to physically couple to the battery-powered portable measuring device, wherein the battery-powered portable measuring device includes an external data connector for providing a wired connection to an external device, and the body portion of the data transmission module is physically coupled to the battery-powered portable measuring device at least in part by physically coupling the data connector of the body portion to the external data connector of the battery-powered portable measuring device;

a field receiver configured to receive the energy supply field from the remote data node;

a wireless data generator that wirelessly communicates the measurement data signals to the remote data node;

a data transmission and energy manager circuit configured to couple through the data connector of the body portion to the external data connector on the battery-powered portable measuring device, and to perform operations comprising:

harvesting energy received by the field receiver, storing at least a portion of the harvested energy in the data transmission module, and managing the harvested energy;

establishing a communication connection with the remote data node;

inputting the measurement data from the battery-powered portable measuring device through the data connector of the body portion as physically coupled to the external data connector of the battery-powered portable measuring device; and wirelessly communicating measurement data signals corresponding to the input measurement data to the remote data node using the wireless data generator, wherein:

the battery-powered portable measuring device is powered by a battery that is not part of the data transmission module and is not connected as a power supply to the data transmission module, and is configured to operate and display the measurement data on a self-contained display, regardless of whether it is coupled to the data transmission module; and the wireless data generator is configured to wirelessly communicate the measurement data signals to the remote data node using only a) the harvested energy or b) a modulated reflection of, or coupling to, the received energy supply field from the remote data node, or c) a combination of a) and b).

2. The data transmission module of claim 1, wherein the data transmission module does not include a chemical battery.

3. The data transmission module of claim 1, wherein at least a majority of energy used by the data transmission module to transmit the measurement data signals to the remote data node is provided by b) a modulated reflection of, or coupling to, electromagnetic energy received from the remote data node by the field receiver.

4. The data transmission module of claim 1, wherein the energy supply field generated by the remote data node is an oscillating magnetic field and the field receiver comprises at least one electrical loop and a resonant circuit configured to inductively couple to the oscillating magnetic field.

5. The data transmission module of claim 4, wherein at least a majority of energy used by the data transmission module to transmit the measurement data signals to the remote data node is provided by a) the stored energy in the data transmission module.

6. The data transmission module of claim 1, wherein electromagnetic energy of the energy supply field generated by the remote data node is electromagnetic radiation and the field receiver comprises an antenna.

7. The data transmission module of claim 1, wherein the battery-powered portable measuring device is one of a caliper or micrometer, and the measurement data is related to a physical dimension of a measured object.

8. The data transmission module of claim 1, wherein the remote data node comprises a power supply, a display, one or more processors, and a memory coupled to the one or more processors, the memory storing data corresponding to measurement data signals that are wirelessly received from the data transmission module.

9. The data transmission module of claim 1, wherein if the energy received by the field receiver is determined to be below a threshold level, operations for wirelessly communicating measurement data signals to the remote data node are at least one of suspended or cancelled.

10. The data transmission module of claim 1, wherein transmission cycle termination operations are performed subsequently to successfully wirelessly communicating measurement data signals to the remote data node and terminate at least some operations of the data transmission module until an actuator of the data transmission module is operated manually by a user or a request for data is received from the remote data node.

11. The data transmission module of claim 1, wherein the body portion is configured to physically couple to a back portion of the battery-powered portable measuring device, the back portion being on an opposite side of the battery-powered portable measuring device relative to the self-contained display that is on a front portion of the battery-powered portable measuring device.

12. The data transmission module of claim 1, wherein a back portion of the battery-powered portable measuring device comprises a back surface on an opposite side of the battery-powered portable measuring device relative to the self-contained display that is on a front portion of the battery-powered portable measuring device and the field receiver is arranged in a plane that is approximately parallel to the back surface and there is a separation between the field receiver and the battery-powered portable measuring device when the body portion of the data transmission module is physically coupled to the battery-powered portable measuring device.

13. The data transmission module of claim 12, wherein a total thickness of the data transmission module is at most 12 mm, and the field receiver is arranged at a separation distance of at least 4 millimeters from the battery-powered portable measuring device as measured from the back surface of the battery-powered portable measuring device when the body portion of the data transmission module is physically coupled to the battery-powered portable measuring device.

14. The data transmission module of claim 1, wherein the remote data node comprises at least two portions which are physically separate, and a first one of the portions includes a field generator and is configured to generate at least one energy supply field, and a second one of the portions is configured to wirelessly receive the measurement data signals from the data transmission module.

15. A method for utilizing a data transmission module to wirelessly transmit measurement data signals from a battery-powered portable measuring device to a remote data node, wherein:
the remote data node is configured to generate an energy supply field and to wirelessly receive the measurement data signals from the data transmission module;
the data transmission module comprises:
a body portion including a data connector which is configured to physically couple to the battery-powered portable measuring device, wherein the battery-powered portable measuring device includes an external data connector for providing a wired connection to an external device, and the body portion of the data transmission module is physically coupled to the battery-powered portable measuring device at least in part by physically coupling the data connector of the body portion to the external data connector of the battery-powered portable measuring device;
a field receiver configured to receive the energy supply field from the remote data node;
a wireless data generator that wirelessly communicates the measurement data signals to the remote data node; and
a data transmission and energy manager circuit configured to couple through the data connector of the body portion to the external data connector on the battery-powered portable measuring device; and
the method comprises:
harvesting energy from the energy supply field of the remote data node as received by the field receiver of the data transmission module and storing at least a portion of the harvested energy in the data transmission module;
establishing a communication connection between the data transmission module and the remote data node;
inputting the measurement data from the battery-powered portable measuring device through the data connector of the body portion as physically coupled to the external data connector of the battery-powered portable measuring device; and
wirelessly transmitting measurement data signals corresponding to the input measurement data to the remote data node using the wireless data generator of the data transmission module, wherein the wireless data generator is configured to wirelessly transmit the measurement data signals to the remote data node using a) the harvested energy or b) a modulated reflection of, or coupling to, the received energy supply field from the remote data node, or c) a combination of a) and b).

16. The method of claim 15, wherein the battery-powered portable measuring device is powered by a battery that is not part of the data transmission module and is not connected as a power supply to the data transmission module, and is configured to operate and display measurement data corresponding to the measurement data signals on a self-contained display, regardless of whether the battery-powered portable measuring device is coupled to the data transmission module.

17. The method of claim 15, wherein the data transmission module does not include a chemical battery.

18. The method of claim 15, wherein a back portion of the battery-powered portable measuring device comprises a back surface on an opposite side of the battery-powered portable measuring device relative to a self-contained display that is on a front portion of the battery-powered portable measuring device and the field receiver is arranged in a plane that is approximately parallel to the back surface and there is a separation between the field receiver and the battery-powered portable measuring device when the body portion of the data transmission module is physically coupled to the battery-powered portable measuring device.

19. A system for wirelessly transmitting measurement data signals to a remote data node, the system comprising:
- a remote data node configured to generate an energy supply field and to wirelessly receive measurement data signals;
- a battery-powered portable measuring device comprising a self-contained display and an external data connector for providing a wired connection to an external device, wherein the battery-powered portable measuring device is powered by a battery and is configured to measure a workpiece and display corresponding measurement data on the self-contained display, regardless of whether the battery-powered portable measuring device is coupled to a data transmission module; and
- a data transmission module comprising:
  - a body portion including a data connector configured to physically couple to the battery-powered portable measuring device, wherein the body portion of the data transmission module is physically coupled to the battery-powered portable measuring device at least in part by physically coupling the data connector of the body portion to the external data connector of the battery-powered portable measuring device;
  - a field receiver configured to receive the energy supply field from the remote data node;
  - a wireless data generator that wirelessly communicates the measurement data signals to the remote data node; and
  - a data transmission and energy manager circuit configured to couple through the data connector of the body portion to the external data connector on the battery-powered portable measuring device and to perform operations comprising:
    - harvesting energy received by the field receiver from the remote data node and storing at least a portion of the harvested energy in the data transmission module;
    - establishing a communication connection with the remote data node;
    - inputting the measurement data from the battery-powered portable measuring device through the data connector of the body portion as physically coupled to the external data connector of the battery-powered portable measuring device; and
    - wirelessly communicating measurement data signals corresponding to the input measurement data to the remote data node using the wireless data generator, wherein the wireless data generator is configured to wirelessly communicate the measurement data signals to the remote data node using at least primarily a) the harvested energy or b) a modulated reflection of, or coupling to, the received energy supply field from the remote data node, or c) a combination of a) and b).

20. The system of claim 19, wherein a back portion of the battery-powered portable measuring device comprises a back surface on an opposite side of the battery-powered portable measuring device relative to the self-contained display that is on a front portion of the battery-powered portable measuring device and the field receiver is arranged in a plane that is approximately parallel to the back surface and there is a separation between the field receiver and the battery-powered portable measuring device when the body portion of the data transmission module is physically coupled to the battery-powered portable measuring device.

* * * * *